(12) United States Patent
Hung et al.

(10) Patent No.: US 10,347,492 B2
(45) Date of Patent: Jul. 9, 2019

(54) MODIFYING WORK FUNCTION OF A METAL FILM WITH A PLASMA PROCESS

(71) Applicant: Applied Materials, Inc., Santa Clara, CA (US)

(72) Inventors: Steven C. H. Hung, Sunnyvale, CA (US); Johanes S. Swenberg, Los Gatos, CA (US); Wei Liu, San Jose, CA (US); Houda Graoui, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/874,132

(22) Filed: Jan. 18, 2018

(65) Prior Publication Data

US 2018/0218911 A1     Aug. 2, 2018

Related U.S. Application Data

(60) Provisional application No. 62/451,457, filed on Jan. 27, 2017.

(51) Int. Cl.
| | |
|---|---|
| *H01L 21/28* | (2006.01) |
| *H01L 21/321* | (2006.01) |
| *H01L 29/49* | (2006.01) |
| *H01L 21/285* | (2006.01) |
| *H01L 21/67* | (2006.01) |
| *H01L 29/51* | (2006.01) |

(52) U.S. Cl.
CPC ...... *H01L 21/28088* (2013.01); *H01L 21/321* (2013.01); *H01L 29/4966* (2013.01); *H01L 21/28568* (2013.01); *H01L 21/67017* (2013.01); *H01L 21/67167* (2013.01); *H01L 29/513* (2013.01); *H01L 29/517* (2013.01)

(58) Field of Classification Search
CPC .......... H01L 21/28088; H01L 29/4966; H01L 21/321; H01L 21/67017; H01L 21/28568; H01L 21/67167
USPC ....................................................... 438/592
See application file for complete search history.

(56) References Cited

U.S. PATENT DOCUMENTS

2011/0207314 A1*   8/2011  Niimi ................ H01L 21/28088
                                                              438/592

OTHER PUBLICATIONS

"Electron Work Function of the Elements", https://public.wsu.edu/~pchemlab/documents/Work-functionvalues.pdf.*

(Continued)

*Primary Examiner* — Anthony Ho
*Assistant Examiner* — Mohammad M Hoque
(74) *Attorney, Agent, or Firm* — Patterson + Sheridan, LLP

(57) ABSTRACT

A sequential plasma process is employed to enable the modification of the work function of a p-type metal layer in a metal gate structure. The sequential plasma process includes a plasma hydrogenation and a plasma process that includes electronegative species. The sequential plasma process is performed on a p-type metal layer in a film stack, thereby replacing suboxides and/or other non-stoichiometrically combined electronegative atoms disposed on or within layers of the film stack with stoichiometrically combined electronegative atoms, such as O atoms. As a result, the work function of the p-type metal layer can be modified without changing a thickness of the p-type metal layer.

17 Claims, 17 Drawing Sheets

(56) References Cited

OTHER PUBLICATIONS

Hasan, MD. Mehedi, "Work Function Tuning in Sub-20nm Titanium Nitride (TiN) Metal Gate: Mechanism and Engineering," King Abdullah University of Science and Technology, Thuwal, Kingdom of Saudi Arabia, Jul. 2011, 68 pages.

Filliot, F. et al., "Study of metal gate work function modulation using plasma and SiH4 treated TiN thin films," Article, Mat. Res. Soc. Symp. Proc. vol. 786, 2004, Accessed Online https://www.researchgate.net/publication/232003039, 8 pages.

* cited by examiner

MODIFYING WORK FUNCTION OF A METAL FILM WITH A PLASMA PROCESS

CROSS-REFERENCE TO RELATED APPLICATIONS

This application claims benefit of U.S. Provisional Patent Application Ser. No. 62/451,457 filed Jan. 27, 2017, which is entirely incorporated herein by reference.

BACKGROUND

Field

Embodiments described herein generally relate to a method and apparatus for processing semiconductor substrates, and more particularly, to modifying a work function of a metal film processing.

Description of the Related Art

In a field-effect transistor (FET), threshold voltage is the minimum gate-to-source voltage differential required to create a conducting path between the source and drain terminals and thereby turn the FET on. That is, when the gate voltage, i.e., the voltage applied to the gate of the FET, is above the threshold voltage, there are sufficient electrons in the channel of the FET at the oxide-silicon interface to create a low-resistance channel in which charge can flow between the source and the drain. Conversely, when the gate voltage is below the threshold voltage, the transistor is off, in which case there is no current between the source and the drain of the transistor, except for leakage current.

Since the threshold voltage determines the requirements for turning a transistor on or off, precise control of the threshold voltage is important in designing a properly operating transistor. As is well-known, threshold voltage of a transistor is a function of the thickness and dielectric constant of the transistor gate dielectric. Consequently, one technique for designing a transistor to operate with a particular threshold voltage involves scaling the gate dielectric thickness downward, i.e. reducing the dielectric thickness proportional to reductions in other important transistor dimensions, such as transistor length and width.

However, as transistors are reduced in size with each technology node, precise control of threshold voltage by scaling gate dielectric thickness can be impracticable. Specifically, with a linear reduction of the thickness of the conventional oxide/oxynitride dielectric layer in some FETs, there is an exponential increase in gate leakage, resulting in increased power consumption. Furthermore, the thickness of the dielectric layer is now close to a few atomic layers, raising reliability concerns. Thus, adjusting threshold voltage in a transistor by continued downward scaling of gate dielectric thickness is problematic.

Threshold voltage is also a function of the thickness and work function of the gate conductor material. Thus, another technique for controlling the threshold voltage of a particular transistor involves using a gate conductor material that has a work function close to a target value, and, in some cases, selecting the deposited thickness of the gate conductor material to fine-tune the effective work function of the gate conductor material to the target value. For example, titanium nitride (TiN), having a work function value of about 4.6 eV, is commonly employed as a gate conductor material in some metal gate structures. Since the work function of a deposited TiN layer varies with the thickness of the deposited layer, the work function of TiN can be tuned from about 4.5 eV to about 4.7 eV.

However, as transistors are reduced in size with each technology node, reducing the thickness of such a TiN layer to decrease the effective work function of the TiN layer is not be a viable option. For instance, with TiN layers in metal gate structures currently in the 10-20 Å range, a further decrease in thickness may result in a TiN layer of only a few atomic layers. Thus, adjusting threshold voltage in a transistor by reducing metal gate material thickness is also problematic.

Accordingly, there is a need in the art for improved techniques to modify threshold voltage of a transistor.

SUMMARY

Embodiments described herein generally relate to plasma processing of a metal layer to modify a work function value of the metal layer. In one embodiment, a method of forming a transistor includes depositing a high-k dielectric layer over a surface of a semiconductor material, wherein the surface of the semiconductor material has a first work function value, after depositing the high-k dielectric layer, depositing a p-type metal layer over the semiconductor material and the high-k dielectric layer, wherein the p-type metal layer has an exposed surface and a second work function value, exposing the exposed surface of the p-type metal layer to plasma-excited electronegative species to change the first work function value to a third work function value, wherein the third work function value is between the first work function value and the second work.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a method and apparatus for modifying the work function of a metal layer in a conductive structure, such as a metal gate structure. In the embodiments, a metal layer that is included in the conductive structure is exposed to plasma that includes one or more plasma-excited, electronegative species. The one or more electronegative species are incorporated into the metal layer, and thereby modify the work function of the metal layer. As a result, the threshold voltage of a transistor that includes such a metal gate structure can be adjusted without changing the thickness of the metal layer.

In various embodiments, the electronegative species incorporated into the metal layer are combined stoichiometrically with the metal atoms in the lattice of the metal layer, so that molecules formed by the electronegative species and metal atoms in the metal layer are electroneutral. For example, in a titanium (Ti) metal layer exposed to oxygen- (O) containing plasma-excited species, O atoms combine with Ti atoms to form titanium dioxide ($TiO_2$), which is an electroneutral molecule. By contrast, O atoms that combine with Ti in the metal layer via exposure to air and/or via atmospheric anneal processes are typically sub-oxides (i.e., metal-rich), and are therefore electropositive. The incorporation and/or formation of electronegative species in a metal layer of a metal gate structure has been shown to alter the work function of the metal layer. The work function of a metal layer is described in greater detail below in conjunction with FIG. 1.

Work Function and Threshold Voltage

Figure 1:
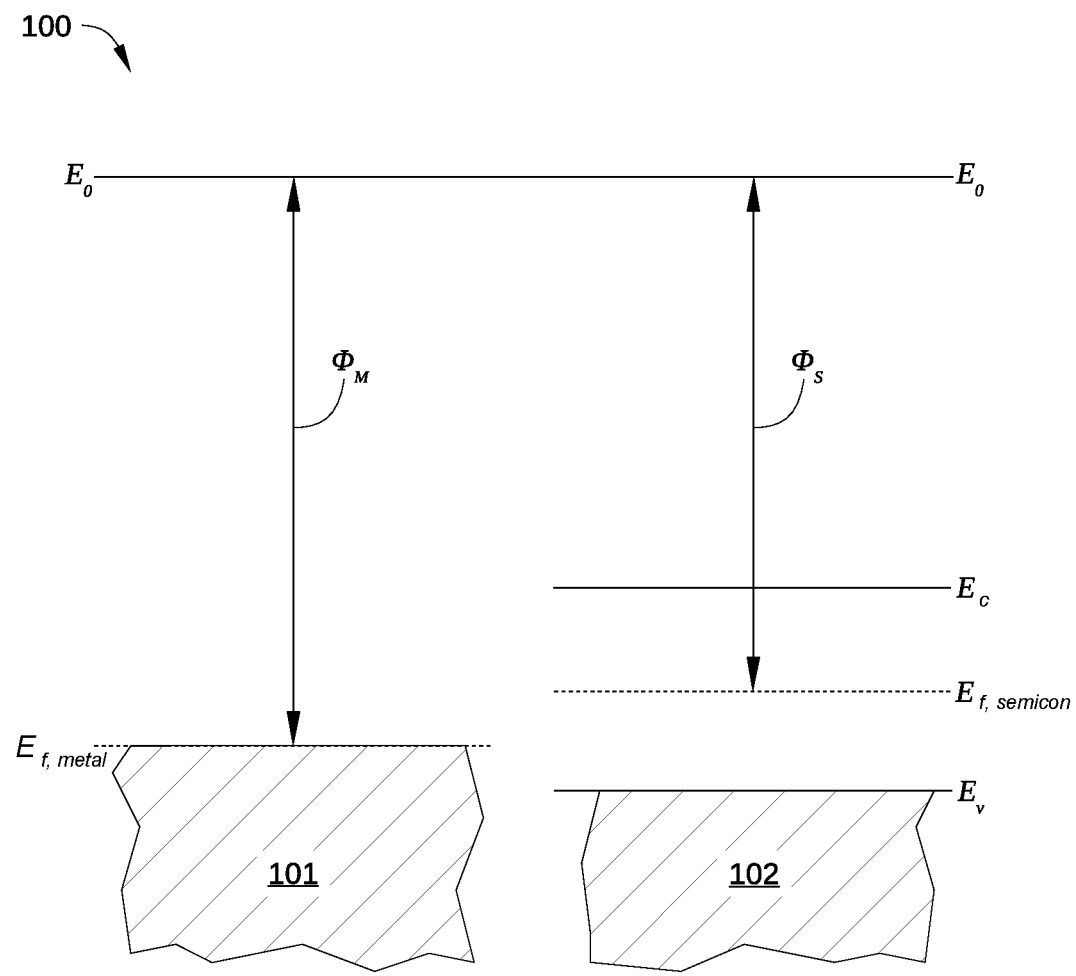
FIG. 1 sets forth an energy diagram depicting various allowed energy levels of electrons in a metal and in a semiconductor.

FIG. 1 sets forth an energy diagram 100 depicting various allowed energy levels of electrons in a metal 101 and electrons in a semiconductor 102. For example, metal 101 may be a TiN layer in a p-metal gate structure of a transistor, and semiconductor 102 may be a channel of the transistor that is formed from silicon (Si) and is disposed proximate the p-metal gate structure.

As shown, energy diagram 100 includes a free-electron energy $E_0$, which is a reference level for energy representing energy that an electron has if it is free of the influence of metal 101 or semiconductor 102. In addition, energy diagram 100 shows a Fermi energy $E_{f,metal}$ for metal 101 and a Fermi energy $E_{f,semicon}$ for semiconductor 102, where the Fermi energy refers to the energy of the highest occupied electron when the system (i.e., a bulk portion of metal 101 or a bulk portion of semiconductor 102) is in the ground state. Also shown are a metal work function $\phi_m$ for metal 101 and a semiconductor work function $\phi_s$ for semiconductor 102, where the work function of a particular material is the difference between the free-electron energy $E_0$ and the Fermi energy of that particular material. For semiconductor 102, energy diagram 100 also shows the conductance band edge $E_c$ and the valence band edge $E_v$.

As noted above, the threshold voltage of a transistor is a function of the work function of the gate conductor material. Thus, when metal 101 is the gate conductor metal of a transistor, by modifying metal work function $\phi_m$ of material 101, the threshold voltage of the transistor can be adjusted. More specifically, for a transistor with a metal gate formed by metal 101 and a channel formed by semiconductor 102, the threshold voltage of the transistor can be adjusted by moving the work function $\phi_m$ value closer to the conductance band edge $E_c$ or to valence band edge $E_v$.

As is known in the art, changing the thickness of some metal layers can alter the work function of the metal. However, given the physical constraints for fabricating transistors at smaller technology nodes, such as the 22 nm technology node and beyond (e.g., smaller device sizes), changing the thickness of a constituent metal layer of a transistor to modify the work function of the metal layer is generally no longer feasible. Furthermore, for very thin layers of a metal, such as a few 10 s of nanometers, the work function of the metal may vary significantly from that of a conventional sized thicker layer of the same metal. This is likely due to the fact that such thin layers consist of such a small number of metal atoms that cannot donate sufficient electrons to behave in the same way as a bulk region of a thicker metal layer. Thus, in many cases, at smaller technology nodes, the work function of certain metal layers may actually vary away from a desired value previously achieved for the same metal material in larger transistors. According to embodiments of the disclosure, the work function of a metal layer in a metal gate structure is modified by being exposed to plasma that includes one or more plasma-excited, electronegative species. Thus, both of the above issues associated with the work function of very thin metal layers in a metal gate structure of a transistor can be addressed. One such metal gate structure is illustrated in FIG. 2.

Metal Gate Structure with Modified Work Function

Figure 2:
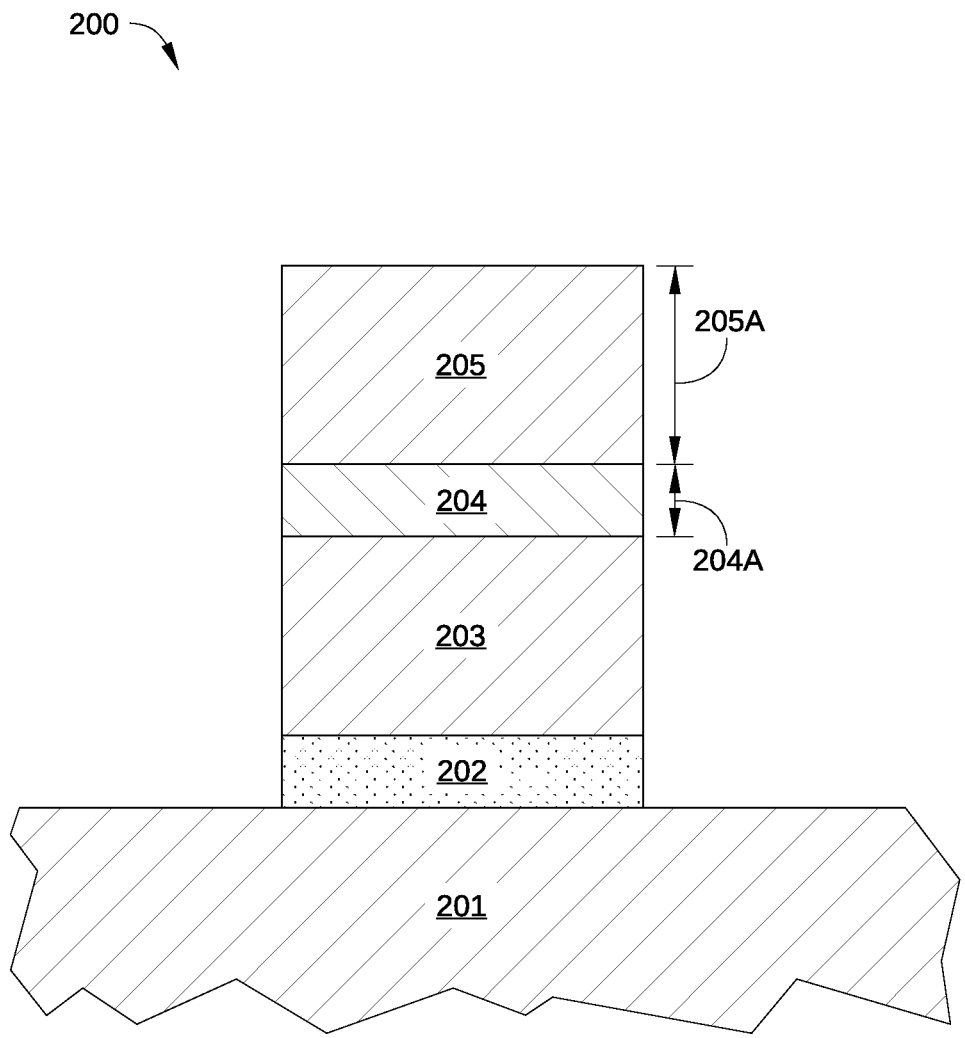
FIG. 2 illustrates a cross-sectional view of a metal gate structure formed according to an embodiment of the disclosure.

FIG. 2 illustrates a cross-sectional view of a metal gate structure 200 formed according to an embodiment of the disclosure. Metal gate structure 200 may be any portion of a semiconductor device that is configured to conduct electrical current and benefits from having a specific work function. In the embodiment illustrated in FIG. 2, metal gate structure 200 is depicted as a conductive structure for providing electrical current or voltage to a gate region of the semiconductor device. As such, metal gate structure 200 is formed on a semiconductor substrate 201 as part of an FET, such as a metal-oxide-semiconductor field-effect transistor (MOSFET). More specifically, metal gate structure 200 is configured as a metal gate electrode of a pMOSFET, and consequently includes one or more p-type metal layers, as opposed to n-type metal layers.

Metal gate structure 200 is a stack of multiple material layers formed on a semiconductor substrate 201 and includes, for example, an interfacial layer 202 disposed on semiconductor substrate 201, a high-k dielectric layer 203 disposed on the interfacial layer 202, a p-type metal capping layer 204 disposed on the high-k dielectric layer 203, and a p-type metal gate electrode layer 205 disposed on the p-type metal capping layer 204. In the embodiment illustrated in FIG. 2, the various layers of the metal gate structure 200 are depicted as a simple film stack formed on the semiconductor substrate 201. In practice, metal gate structure 200 may be formed in a contact well or other cavity formed in an insulating or dielectric material, such as silicon dioxide ($SiO_2$), silicon nitride ($Si_3N_4$), or multiple layers thereof. Thus, one or more of interfacial layer 202, high-k dielectric layer 203, p-type metal capping layer 204, and p-type metal gate electrode layer 205 may be material layers that are conformally deposited within such a cavity.

Semiconductor substrate 201 may be any suitable semiconductor substrate on which metal gate structure 200 can be formed. As such, semiconductor substrate 201 may be formed from any suitable semiconductor material including, but not limited to Si (Si), Ge (germanium), silicon-germanium (Si—Ge), silicon-germanium-carbon (SiGeC), gallium (Ga), gallium arsenide (GaAs), indium arsenide (InAs), indium phosphide (InP), and all other III/V or II/VI compound semiconductors. Alternatively or additionally, semiconductor substrate 201 may be a layered semiconductor such as, for example, Si/Si—Ge, a semiconductor-on-insulator (SOI) or a Si—Ge-on-insulator (SiGOI).

In some embodiments, metal gate structure 200 is configured as a metal gate electrode of a pMOSFET. In such embodiments, the portion of semiconductor substrate 201 proximate to the interfacial layer 202 is configured as a channel region of an FET, and therefore includes an n-type semiconductor material.

The interfacial layer 202 is disposed on semiconductor substrate 201 between semiconductor substrate 201 and high-k dielectric layer 203, and is configured as an interfacial oxide layer suitable for application in metal gate structure 200. In embodiments in which semiconductor substrate 201 includes a Si-containing material, the interfacial layer 202 may include silicon oxide ($SiO_x$), silicon oxynitride (SiNO, $Si_2NO$, $Si_2N_2O$), and/or a nitrided silicon oxide. In embodiments in which semiconductor substrate 201 is other than a Si-containing semiconductor material, the interfacial layer 202 may comprise a semiconductor oxide, a semiconducting oxynitride and/or a nitrided semiconducting oxide.

The interfacial layer 202 may be formed via any suitable thermal or wet growing technique, for example, oxidation or oxynitridation. For example, and without limitation, the interfacial layer 202 may be formed by a wet chemical oxidation process that includes treating a cleaned surface of semiconductor substrate 201, such as an HF-last treated semiconductor surface, with a mixture of ammonium hydroxide, hydrogen peroxide and water. Alternatively, the interfacial layer 202 may be formed by treating an HF-last treated semiconductor surface in ozonated aqueous solutions. Alternatively, the interfacial layer 202 may be formed by any suitable thermal oxidation technique.

High-k dielectric layer 203 may be a gate dielectric layer or other dielectric layer in metal gate structure 200, and includes a so-called "high-k dielectric" material. More specifically, high-k dielectric layer 203 includes one or more materials that have a dielectric constant greater than that of $SiO_2$, such as a material having a dielectric constant of at least about 4.0, or ideally at least about 10.0. In addition, the high-k dielectric material included in high-k dielectric layer 203 is suitable for use in an integrated circuit. Thus, in addition to a high dielectric constant, the one or more high-k dielectric materials included in high-k dielectric layer 203 also ideally have the ability to prevent diffusion of dopants, few electrical defects that can compromise breakdown performance, good thermal stability, and high recrystallization temperature. Examples of such high-k dielectric materials suitable for use in high-k dielectric layer 203 include, without limitation, silicon nitride, silicon oxynitride, metal oxides, metal nitrides, metal oxynitrides and/or metal silicates. In some embodiments, high-k dielectric layer 203 includes one or more of hafnium oxide ($Hf_xO_y$), zirconium oxide ($ZrO_2$), hafnium silicate oxides ($Hf_xSi_{1-x}O_y$) or other hafnium-based dielectrics, lanthanum oxides ($La_2O_3$), aluminum oxide ($Al_2O_3$), titanium oxide ($TiO_2$), strontium titanate ($SrTiO_3$), lanthanum aluminate ($LaAlO_3$), yttrium oxide ($Y_2O_3$), hafnium silicate oxides ($Hf_xSi_{1-x}O_y$), lanthanum oxides ($La_2O_3$), and/or multilayered stacks thereof.

High-k dielectric layer 203 may be formed via any suitable deposition method, including a thermal growth process such as, for example, an oxidation, nitridization or oxynitridization process. Alternatively, high-k dielectric layer 203 may be formed by one or more deposition process including, but not limited to chemical vapor deposition (CVD), plasma enhanced chemical vapor deposition (PECVD), metalorgano chemical vapor deposition (MOCVD), atomic layer deposition (ALD), evaporation, reactive sputtering, chemical solution deposition and/or any combination of thereof.

P-type metal capping layer 204 is a p-type metal layer disposed on high-k dielectric layer 203 that is typically configured as an electrically conductive protective layer on high-k dielectric layer 203. In some embodiments, p-type metal capping layer 204 is configured to prevent unwanted oxidation of semiconductor substrate 201 and/or high-k dielectric layer 203. In some embodiments, p-type metal capping layer 204 includes a metal nitride, such as TiN, tantalum nitride (TaN), and the like.

P-type metal capping layer 204 may be formed via any suitable deposition method, including but not limited to physical vapor deposition (PVD), chemical vapor deposition (CVD), plasma enhanced chemical vapor deposition (PECVD), metalorgano chemical vapor deposition (MOCVD), atomic layer deposition (ALD), evaporation, reactive sputtering, chemical solution deposition and/or any combination of thereof.

P-type metal gate electrode layer 205 is a metal layer formed on p-type metal capping layer 204, and includes one or more deposited metal layers. P-type metal gate electrode layer 205 may be formed via any suitable deposition method, including, but not limited to, CVD, PECVD, MOCVD, ALD, evaporation, reactive sputtering, chemical solution deposition and/or any combination of thereof. In some embodiments, p-type metal gate electrode layer 205 is a p-type metal gate material, such as TiN. Other suitable p-type metals may also be used in p-type metal gate electrode layer 205.

In some embodiments, p-type metal gate electrode layer 205 is configured as a gate electrode and/or work function metal of metal gate structure 200. In such embodiments, the one or more metal layers included in p-type metal gate electrode layer 205 are selected to have a gate electrode work function value that facilitates operation of metal gate structure 200 and of a semiconductor device in which metal gate structure 200 is included.

In some embodiments, p-type metal capping layer 204 and p-type metal gate electrode layer 205 are very thin films. For example, in one embodiment of metal gate structure 200, p-type metal capping layer 204 is a TiN layer having a thickness 204A of about 5 nm to about 15 nm, while p-type metal gate electrode layer 205 is a TiN layer having a thickness 205A of about 20 nm to about 40 nm. Consequently, changes to thickness 204A or 205A sufficient to modify the work function of p-type metal capping layer 204 or p-type metal gate electrode layer 205 can negatively impact the operation of a transistor that includes metal gate structure 200. In addition, conventional metal layers having a thickness 204A or 205A may have a different work function than a conventional sized thicker layer of the same metal, and as a result can significantly degrade performance or operation of the transistor. According to various embodiments, the work function of p-type metal capping layer 204 or p-type metal gate electrode layer 205 is modified by exposure to electronegative, plasma-excited species, and not by varying the thickness 204A or 205A.

Physical Model of Modifying Work Function with a Plasma Process

FIGS. 3A-3E are schematic views of a p-type metal layer 350 within metal gate structure 200 at various stages of the fabrication of metal gate structure 200, according to an embodiment of the disclosure. P-type metal layer 350 may represent p-type metal capping layer 204, p-type metal gate electrode layer 205, or any other p-type metal layer included in metal gate structure 200. It is noted that each different p-type metal element suitable for use in metal layer 350 generally has a different three-dimensional crystalline structure or structures. Consequently, one of ordinary skill in the art will readily understand that FIGS. 3A-3E are schematic representations of the crystalline structure of metal layer 350, and are not intended to depict any particular crystalline structure of metal layer 350, such as a body-centered cubic (bcc) structure, a face-centered cubic (fcc) structure, or the like. Thus, the crystalline structure of metal layer 350 is not limited to that illustrated in FIGS. 3A-3E, and may have any other possible crystalline structure or surface termination.

Figure 3A:
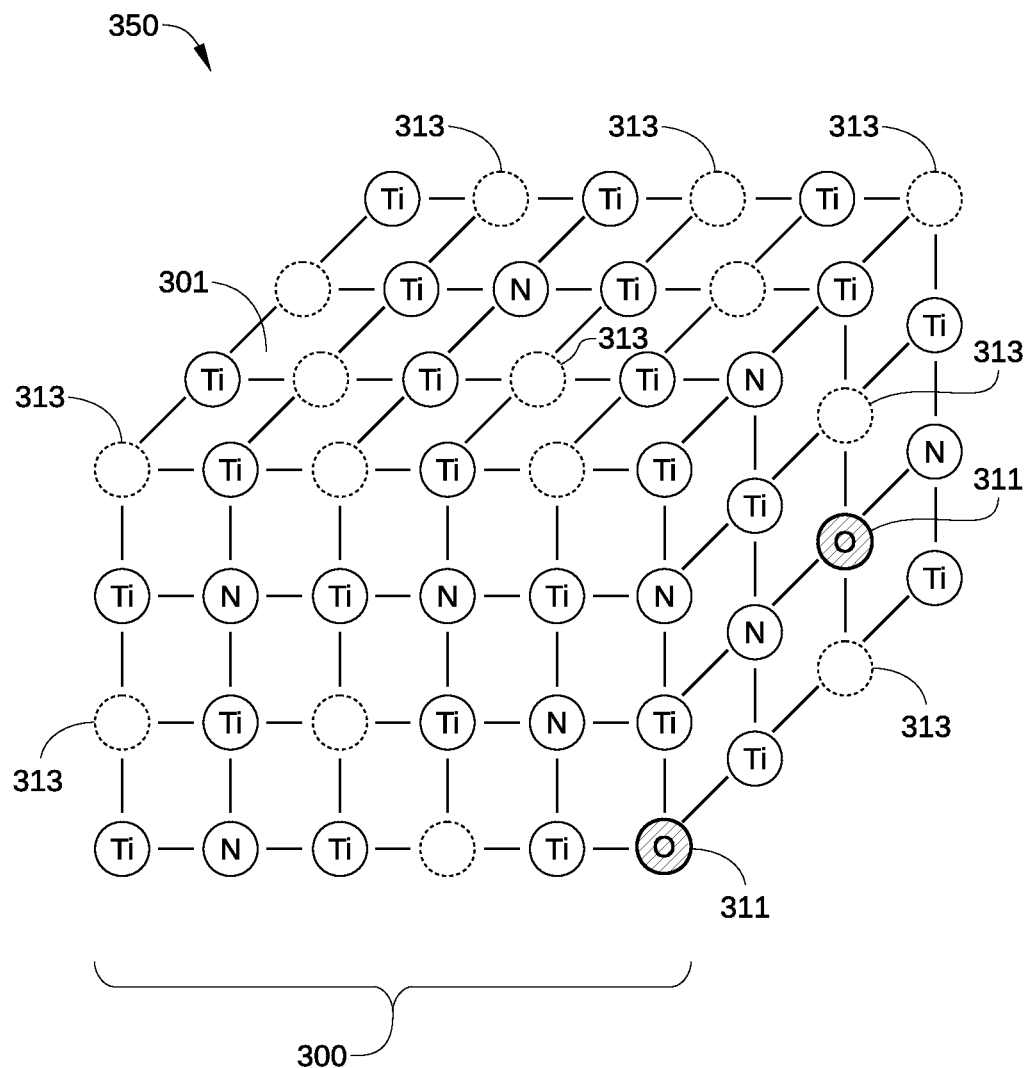
FIGS. 3A-3E are schematic views of a p-type metal layer within a metal gate structure at various stages of the fabrication of metal gate structure, according to an embodiment of the disclosure.

In FIG. 3A, a portion 300 of p-type metal layer 350 is schematically illustrated immediately after p-type metal layer 350 has been deposited and prior to portion 300 being exposed to air. For example, FIG. 3A may depict p-type metal capping layer 204 after being deposited on high-k dielectric layer 203 or p-type metal gate electrode layer 205 after being deposited on metal capping layer 204. Portion 300 includes a surface 301 of portion 300 that will undergo a plasma treatment as described herein. In the embodiment illustrated in FIG. 3A, p-type metal layer 350 is a TiN layer, and is primarily made up of Ti and N atoms. In other embodiments, p-type metal layer 350 may be any other p-type metal suitable for use in metal gate structure 200.

In addition, portion 300 includes a low concentration of bulk O atoms 311 (cross-hatched), typically disposed in a bulk region of portion 300 below surface 301. The bulk O atoms 311 may be incorporated by contamination found in the processing environment during the deposition process used to form portion 300. Further, portion 300 generally includes vacancies 313, which are sites within the crystal lattice of portion 300 where an atom is missing. Vacancies 313 are locations at which additional oxidation within portion 300 may take place when p-type metal layer 350 is exposed to air. It is noted that when p-type metal layer 350 is formed by an atomic layer deposition (ALD) process, vacancies 313 are relatively common due to the film nucleation and growth mechanisms found in an ALD process versus a traditional chemical vapor deposition (CVD) or physical vapor deposition (PVD) process. Thus one or more of the embodiments of the disclosure provide herein may provide significant benefits when used on films formed by an ALD process versus conventional PVD or CVD type processes.

Figure 3B:
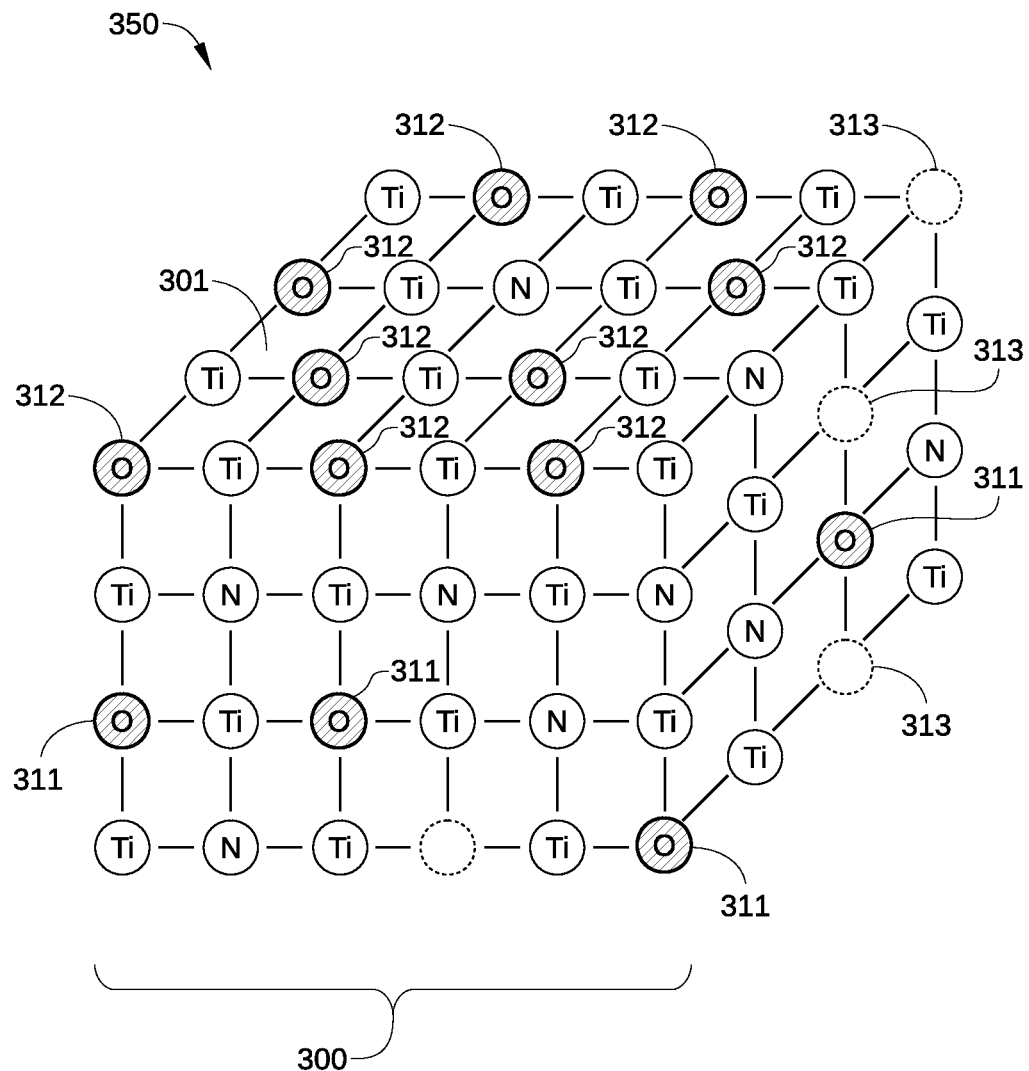

In FIG. 3B, portion 300 is illustrated after being removed from the processing system that deposited p-type metal layer 350. For example, semiconductor substrate 201 on which portion 300 is formed may be exposed to air in preparation for a thermal anneal process. Typically, conventional thermal processing chambers, such as anneal process chambers, are performed in different processing systems from the processing systems that are used to form p-type metal layer 350, due to a difference in the required cleanliness, thermal management control and vacuum level requirements needed to form most advanced device nodes applications today. Thus, in FIG. 3B, portion 300 is illustrated after being exposed to air. As shown, surface 301 has been partially oxidized, with surface O atoms 312 occupying most or all of the vacancies 313 disposed on surface 301. In some cases, some of the vacancies 313 disposed within portion 300 are occupied with bulk O atoms 311 as a result of exposure of portion 300 to air.

Figure 3C:
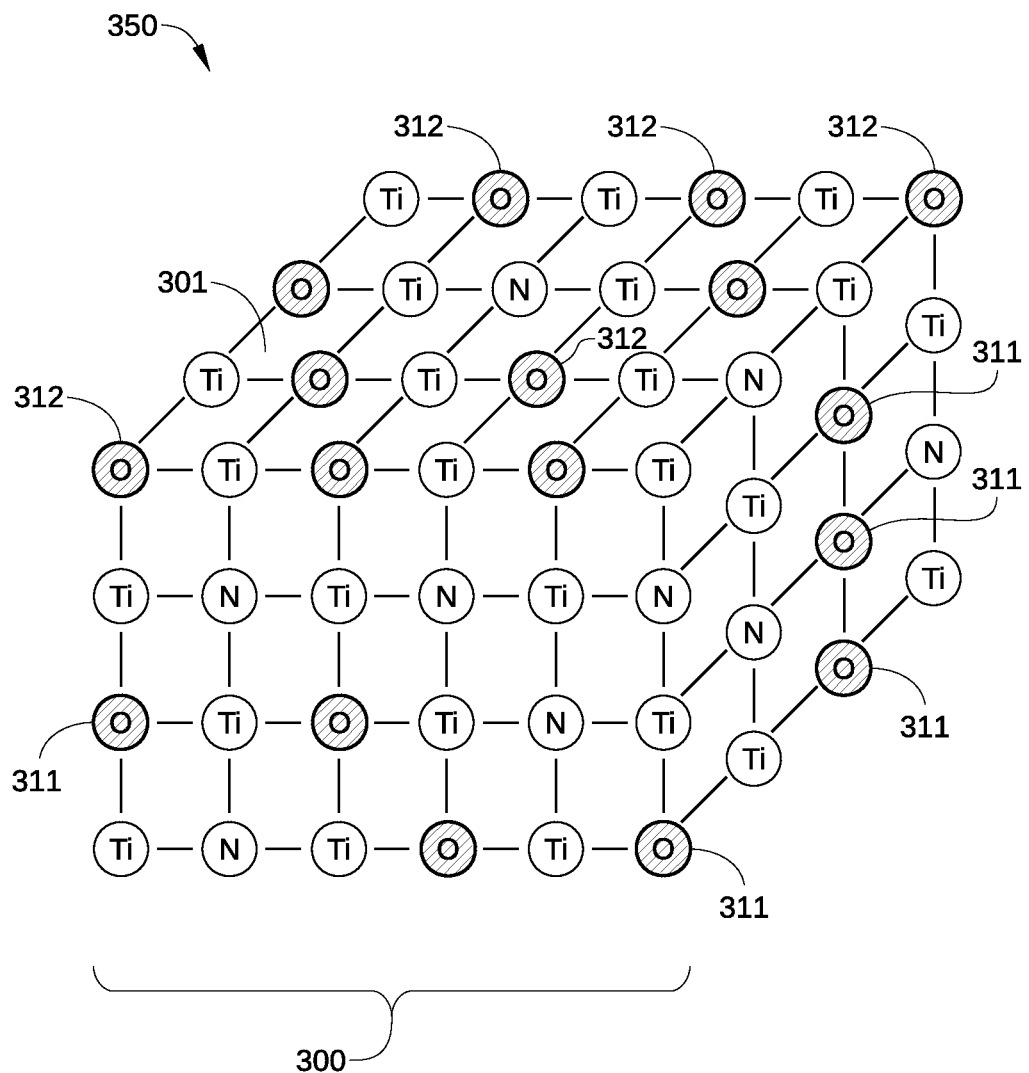

In FIG. 3C, portion 300 is illustrated after undergoing a thermal anneal process, for example to densify p-type metal layer 350 after being deposited. Some or all of the remaining vacancies 313 are filled with bulk O atoms 311 or surface O atoms 312. In some embodiments, bulk O atoms 311 may also displace a portion of the N atoms disposed within portion 300. Thus, the anneal process generally increases the number of both bulk O atoms 311 and surface O atoms 312 in portion 300.

It is noted that, in general, bulk O atoms 311 and surface O atoms 312 that have combined with Ti atoms in p-type metal layer 350 via exposure to air and/or via atmospheric anneal processes typically form suboxides, i.e., metal-rich compounds. Bulk O atoms 311 and surface O atoms 312 in such suboxides are not stoichiometrically combined with the metal atoms in p-type metal layer 350. As a result, the binding energies of atoms associated with the suboxide bonds between bulk O atoms 311/surface O atoms 312 and the Ti atoms in p-type metal layer 350 are quantitatively different than the binding energies of stoichiometrically combined O atoms and the metal atoms in p-type metal layer 350, and typically have different bond orientation and arrangement between the O atoms and the metal atoms in p-type metal layer 350. In addition, the binding energies associated with the above-described suboxide bonds are generally lower than the binding energies associated with stoichiometrically combined O atoms and the metal atoms in p-type metal layer 350.

Figure 3D:
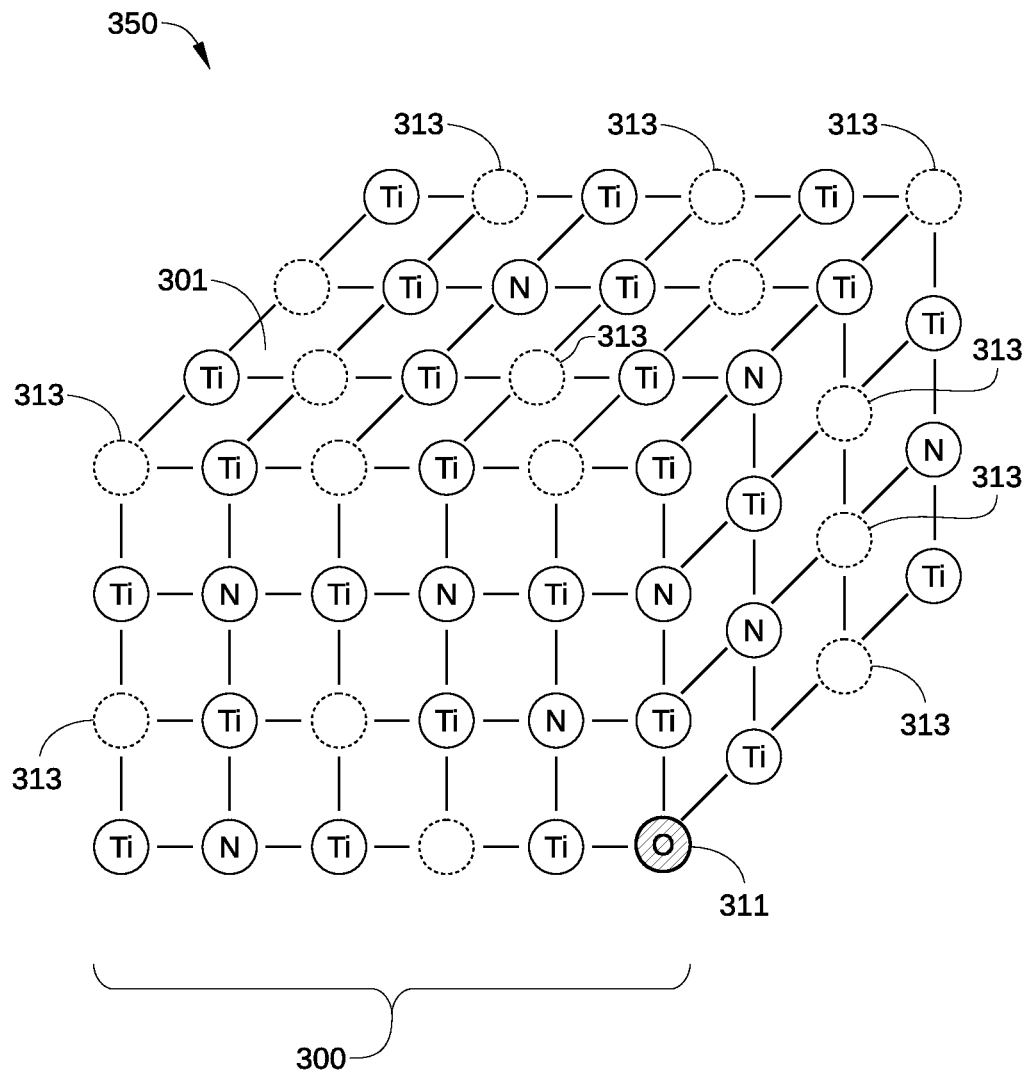

In FIG. 3D, portion 300 is illustrated after being exposed to hydrogen atoms that react with bulk O atoms 311 and/or surface O atoms 312 included in portion 300, according to various embodiments of the disclosure. In some embodiments, bulk O atoms 311 and/or surface O atoms 312 react with hydrogen atoms from a hydrogen-containing plasma as part of a plasma hydrogenation process. The plasma hydrogenation process may be performed in a suitable plasma processing chamber under certain processing conditions. An exemplary plasma processing chamber and plasma processing conditions are each described below for the plasma hydrogenation process. As shown, the hydrogenation process reduces or otherwise removes all or substantially all of the surface O atoms 312 from surface 301, leaving vacancies 313 behind. Moreover, the plasma hydrogenation process may also remove some or all bulk O atoms 311 disposed below surface 301.

Figure 3E:
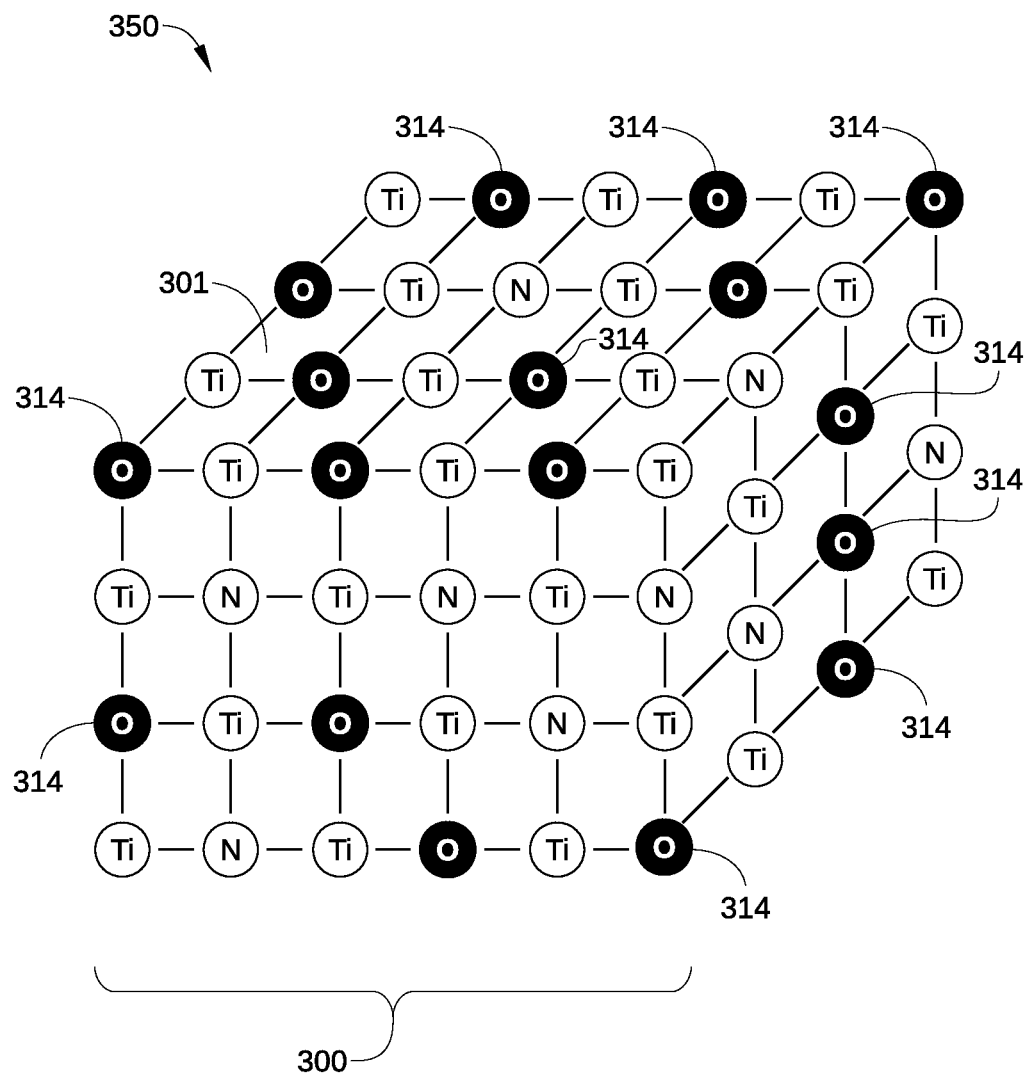

In FIG. 3E, portion 300 is illustrated after undergoing a plasma oxidation process, according to various embodiments of the disclosure. The plasma oxidation process may be performed in a suitable plasma processing chamber under certain processing conditions, and an exemplary plasma processing chamber and plasma processing conditions are each described below for the plasma oxidation process. In some embodiments, the plasma oxidation process may be performed in the same plasma processing chamber that performs the plasma hydrogenation process. In addition, no air break occurs between the plasma or thermal hydrogenation process and the plasma oxidation process. That is, portion 300 is not exposed to air after the plasma hydrogenation process and before the plasma oxidation process.

As shown, the plasma oxidation process causes vacancies 313 to be filled with plasma-deposited O atoms 314. Unlike bulk O atoms 311 or surface O atoms 312, most or all of plasma-deposited O atoms 314 are stoichiometrically combined with atoms in p-type metal layer 350, for example with Ti atoms as $TO_2$. It is noted that the binding energies of stoichiometrically combined plasma-deposited O atoms 314 to the metal atoms in p-type metal layer 350 are quantitatively different than the binding energies of atoms associated with the suboxide bonds between bulk O atoms 311/surface O atoms 312 and the Ti atoms in p-type metal layer 350. This difference in binding energies is illustrated in FIG. 4.

Figure 4:
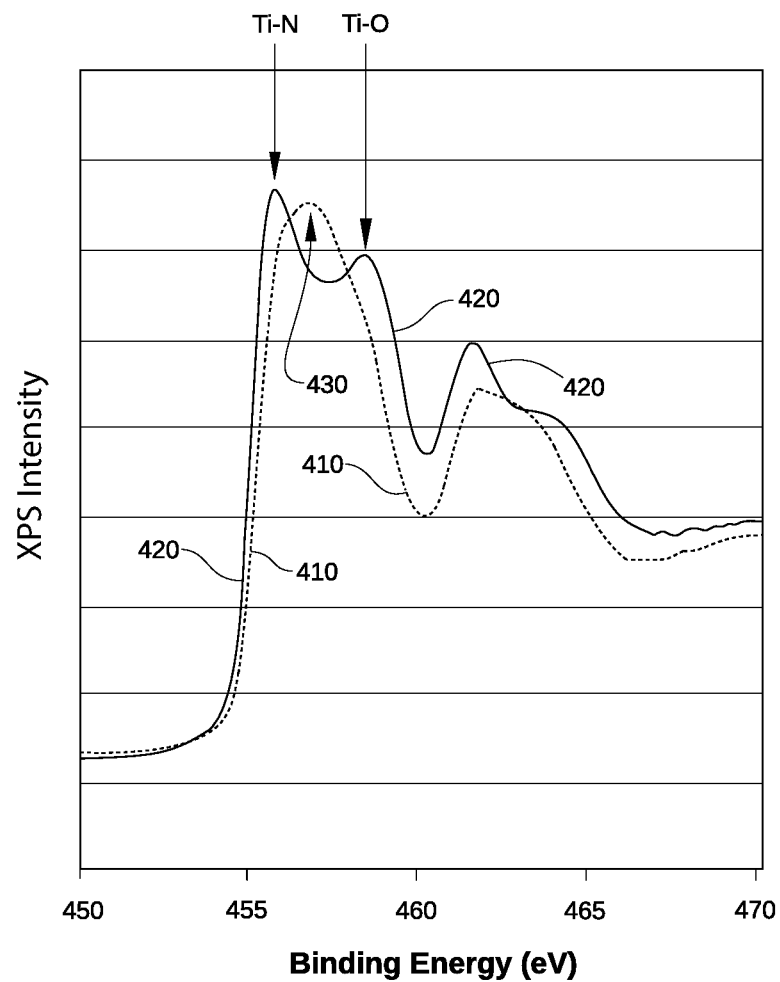
FIG. 4 is a graph of an X-ray Photoelectron Spectroscopy (XPS) spectrum for a deposited TiN film that is not treated with a plasma oxidation process and an XPS spectrum for a similar deposited TiN film after treatment with a plasma oxidation process, according to an embodiment of the disclosure.

FIG. 4 is a graph of an X-ray Photoelectron Spectroscopy (XPS) spectrum 410 for a deposited TiN film that is not treated with a plasma oxidation process and an XPS spectrum 420 for a similar deposited TiN film after treatment with a plasma oxidation process and then exposure to air, according to an embodiment of the disclosure. In some embodiments, the plasma oxidation process includes a sequential plasma hydrogenation process followed by a plasma oxidation process, each of which is described below in conjunction with FIG. 5.

As is well-known in the art, an XPS spectrum of a TiN film may include multiple peaks, each indicating a different relative concentration of different titanium-containing materials. For example, a sharp Ti—O peak at a binding energy of approximately 458.5 eV, indicates the presence of Ti—O bonds and, therefore, the presence of O atoms stoichiometrically combined with Ti atoms, whereas a sharp Ti—N peak at a binding energy of approximately 454.9 eV generally indicates the presence of Ti—N bonds and, therefore, the presence of nitrogen (N) atoms stoichiometrically combined with Ti atoms. Furthermore, the presence of a broader peak that is somewhat lower than the binding energy Ti—O bonds, such as peak 430, can indicate the presence of various suboxides of titanium.

XPS spectrum 410 is associated with a deposited TiN film after being deposited and exposed to air, and XPS spectrum 420 is associated with a similar TiN film after being deposited and exposed to air, and then undergoing a plasma hydrogenation process followed by a plasma oxidation process, as described herein. Thus, XPS spectrum 410 is associated with a surface of a TiN film similar to surface 301 illustrated in FIG. 3B, whereas XPS spectrum 420 is associated with a surface of a TiN film similar to surface 301 illustrated in FIG. 3E.

As shown in FIG. 4, the peak associated with Ti—O bonds is significantly higher in XPS spectrum 420 than in XPS spectrum 410. The higher Ti—O peak in XPS spectrum 420 indicates that treating a TiN film with the plasma hydrogenation process followed by the plasma oxidation process results in an increase in the presence of O atoms in the treated TiN film that are stoichiometrically combined with Ti atoms. Conversely, peak 430, which is associated with various titanium suboxides, is present in XPS spectrum 410 and largely absent in XPS spectrum 420. Thus, peak 430 indicates the presence of significantly more suboxides in the TiN film that has not undergone the plasma hydrogentation and plasma oxidation processes.

System Overview for Modifying Work Function of a Metal Layer

Figure 5:
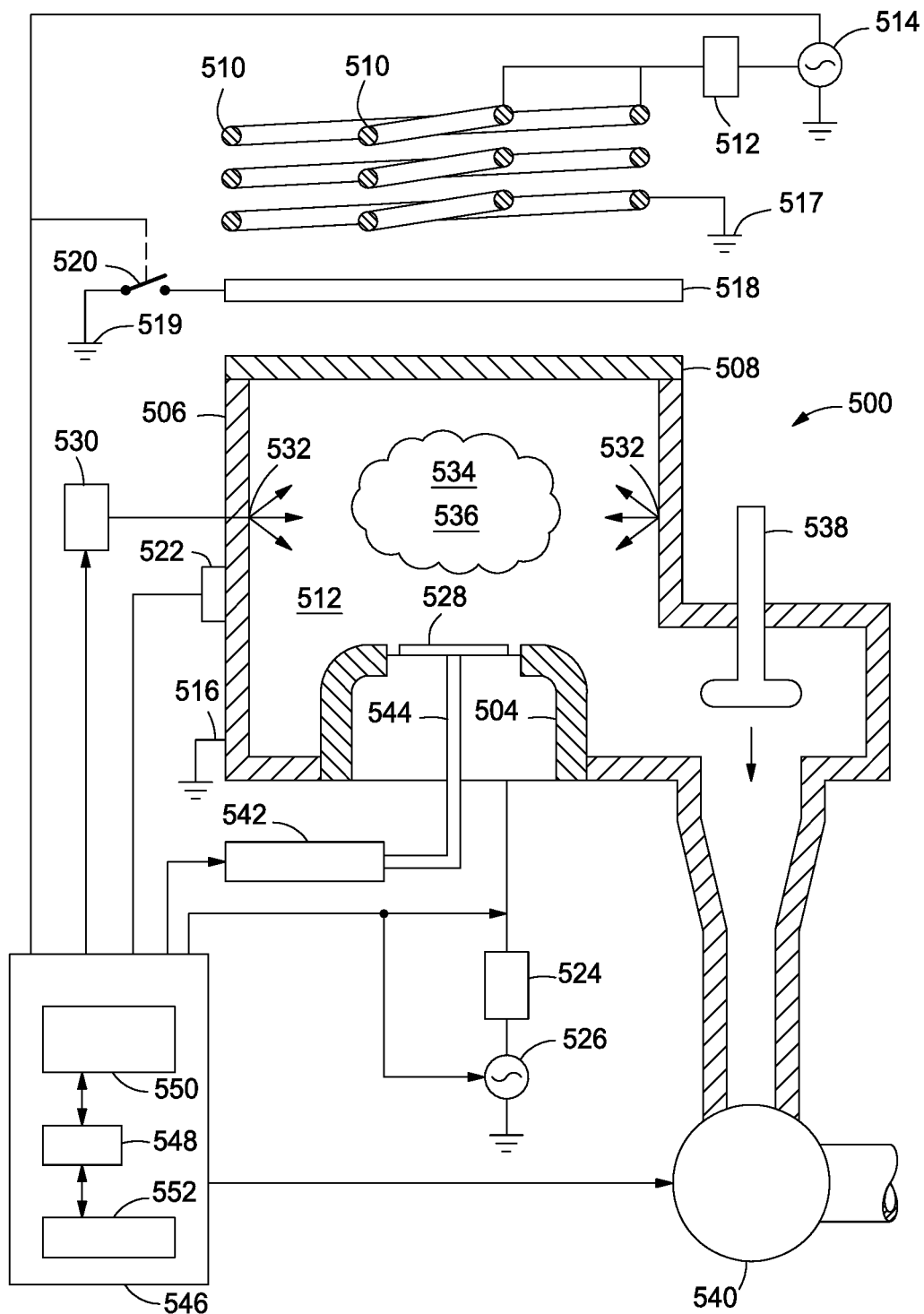
FIG. 5 is a schematic cross sectional view of a plasma processing chamber configured to implement one or more aspects of the present disclosure.

FIG. 5 is a schematic cross sectional view of a plasma processing chamber 500 configured to implement one or more aspects of the present disclosure. Plasma processing chamber 500 may be any suitable plasma processing chamber, such as an inductively coupled plasma (ICP) processing chamber. As shown in FIG. 5, processing chamber 500 may include a chamber wall 506, a chamber lid 508 and a substrate support pedestal 504 disposed within the chamber wall 506. Typically, chamber wall 506 is coupled to an electrical ground 516. Chamber lid 508 may be composed of any suitable dielectric, such as quartz. For some embodiments, dielectric lid 508 may assume a different shape (e.g., dome-shaped). In some embodiments, chamber lid 508 may be coated with a ceramic coating, such as an yttrium containing oxide, for protection from plasma species. In one embodiment, the ceramic coating is a high performance material (HPM) that is composed of a compound $Y_4Al_2O_9$ and a solid solution $Y_{2-x}Zr_xO_3$ ($Y_2O_3$—$ZrO_2$ solid solution). The ceramic coating may have a thickness ranging from about 100 microns to about 300 microns, such as about 200 microns.

Above chamber lid 508, a radio frequency (RF) antenna including at least one inductive coil element 510 may be disposed (two coaxial coil elements are shown). In some embodiments, inductive coil elements 510 may be disposed around at least a portion of chamber wall 506. One end of inductive coil element 510 may be coupled, through a first impedance matching network 512, to an RF power source 514, and the other end may end may be connected to an electrical ground 517 as shown. Power source 514 is typically capable of producing up to 10 kilowatts (kW) at a tunable frequency in a range from 2 to 160 MHz, with 13.56 MHz being a typical operating frequency. The RF power supplied to inductive coil elements 510 may be pulsed (i.e., switched between an on and an off state) or power cycled (i.e., varying a power input from a high level to a low level) at a frequency ranging from 1 to 100 kHz.

A shielding electrode 518 may be interposed between inductive coil elements 510 of the RF antenna and chamber lid 508. Shielding electrode 518 may be alternately electrically floating or coupled to an electrical ground 519 via any suitable means for making and breaking an electrical connection, such as a switch 520 as illustrated in FIG. 5.

For some embodiments, a detector 522 may be attached to chamber wall 506 to facilitate determining when a gas mixture within chamber 500 has been energized into plasma. Detector 522 may, for example, detect the radiation emitted by the excited gases or use optical emission spectroscopy (OES) to measure the intensity of one or more wavelengths of light associated with the generated plasma.

Pedestal 504 may be coupled, through a second impedance matching network 524, to a biasing power source 526. Biasing power source 526 is generally capable of producing an RF signal having a tunable frequency ranging from 2 to 160 MHz and power between 0 and 10 kW, similar to RF power source 514. Optionally, biasing power source 526 may be a direct current (DC) or pulsed DC source.

In operation, a substrate 528, such as a semiconductor substrate, is placed on pedestal 504, and process gases are supplied from a gas panel 530 through entry ports 532 to form a gaseous mixture 534. Typical process gases that are used in one or more of the processes described herein are described below. Entry ports 532 may be coated with the ceramic coating, such as HPM. Gaseous mixture 534 is energized into a plasma 536 in processing chamber 500 by applying power from RF power source 514. The pressure within the interior of processing chamber 500 is controlled using a throttle valve 538 and a vacuum pump 540. In some embodiments, the temperature of chamber wall 506 may be controlled using liquid-containing conduits (not shown) that run through chamber wall 506 or heating elements embedded in chamber wall 506 (e.g., heating cartridges or coils) or wrapped around processing chamber 500 (e.g., heater wrap or tape).

The temperature of substrate 528 is controlled by stabilizing the temperature of pedestal 504. In some embodiments, helium (He) gas from a gas source 542 may be provided via a gas conduit 544 to channels (not shown) formed in the pedestal surface under substrate 528. The helium gas facilitates heat transfer between pedestal 504 and substrate 528. During processing, pedestal 504 can be heated to a steady state temperature, and then the helium gas facilitates uniform heating of the substrate 528. Pedestal 504 can be heated by a heating element (not shown), such as a resistive heater embedded within pedestal 504, or a lamp generally aimed at pedestal 504 or substrate 528 when thereon. Using such thermal control, substrate 528 may be maintained at a temperature between about 20 to 350 degrees Celsius (° C.).

In order to allow for control of the components of processing chamber 500 as described herein, a controller 546 may be provided. Controller 546 may comprise a central processing unit (CPU) 548, a memory 550, and support circuits 552 for CPU 548. Controller 546 may interface with RF power source 514, switch 520, detector 522, and biasing power source 526.

Controller 546 may be any suitable type of general-purpose computer processor that can be used in an industrial setting for controlling various chambers and sub-processors. Memory 550, or other computer-readable medium, for CPU 548 may be one or more of any readily available memory forms, such as random access memory (RAM), read only memory (ROM), a floppy disk, a hard disk, or any other form of digital storage, local or remote. Support circuits 552 may be coupled to CPU 548 in an effort to support the processor in a conventional manner. These circuits may include cache, power supplies, clock circuits, input/output (I/O) circuitry and subsystems, and the like. For some embodiments, control instructions for operating the processing chamber 500 to energize and maintain a plasma may be stored in memory 550 as a software routine. The software routine may also be stored and/or executed by a second CPU (not shown) that is remotely located from the hardware being controlled by CPU 548.

According to some embodiments of the disclosure, a plasma hydrogenation process, followed by a plasma oxidation process, hereinafter referred to as a "sequential hydrogenation/oxidation process," is performed on a metal layer on the substrate to modify the work function of the metal layer. The sequential hydrogenation/oxidation process may include a capacitively coupled plasma process or an inductively coupled plasma process. In some embodiments, plasma for the hydrogenation/oxidation process may be formed in a remote plasma source outside of processing chamber 500, and in other embodiments, the plasma for the plasma process may be formed in-situ, i.e., in processing chamber 500.

In the plasma hydrogenation process, plasma-excited H radicals and/or ions react with bulk O atoms 211 and/or surface O atoms 212 to create vacancies 213, as illustrated in FIG. 3D. In the oxidation process, O radicals and/or ions occupy vacancies 213, and generally produce stoichiometric oxides rather than suboxides, as illustrated in FIG. 3E.

When a metal layer to be treated with the herein described hydrogenation/oxidation process is a thin film with a thickness of about 200 Å or less, an ICP process is generally less likely to damage the metal nitride layer, either during hydrogenation or nitridization. Specifically, in an ICP process the plasma sheath is typically smaller than that in a CCP chamber, and therefore ions traveling therethough typically have proportionally less energy, for example on the order of 10 s of eV, such as 10 to 20 eV. By contrast, ions in a CCP chamber typically have energies on the order of 100 s of eVs (e.g., >200-400 eV), and consequently can create significant damage to the metal nitride layer. Furthermore, an ICP process can provide more oxygen removal from a metal nitride layer than by use of a CCP or remote plasma process, due to the higher density of ions, radicals, and other plasma-excited species generally formed in the an ICP processing chamber and in proximity to the substrate versus CCP and remote plasma sources used in other types of processing chambers. In comparison, a concentration of radicals from CCP and remote plasma sources is relatively low.

In embodiments in which the plasma for the plasma process is formed in-situ, the plasma may be formed via inductive coil elements 510, first impedance matching network 512, RF power source 514, and, in some embodiments, second impedance matching network 524 and biasing power source 526. In such embodiments, the plasma process may include the introduction of one or more process gases into processing chamber 500 that are selected to generate certain plasma species (i.e., ions, neutral atoms, and/or radicals). More specifically, in the case of the plasma hydrogenation process, the one or more process gases are selected to generate plasma-excited hydrogen species, while in the case of the plasma oxidation process, the one or more process gases are selected to generate plasma-excited oxygen species. Thus, for the plasma hydrogenation process, the one or more process gases may include hydrogen ($H_2$), and/or other hydrogen-containing gases, and for the plasma oxidation process, the one or more process gases may include oxygen ($O_2$), and/or other oxygen-containing gases. Alternatively or additionally, the plasma process may include the introduction of one or more carrier and/or inert gases into processing chamber 500, such as argon (Ar).

In some embodiments, the one or more process gases are energized by an RF power source, such as RF power source 514. The RF power may be pulsed at between 2% to 70% duty cycle and may range from about 100 W to about 2500 W. The RF power may be a continuous wave ranging from about 100 W to about 2500 W. The process chamber may have a chamber pressure ranging from about 10 mT to about 200 mT during the plasma process, while the process temperature, for example the temperature of pedestal 504, may range from 20° C. to about 500° C.

In an exemplary embodiment, a plasma hydrogenation process is performed at a process temperature that is between about 400° C. and about 500° C., a chamber pressure that is between about 5 mT and about 20 mT, an RF power that is between about 1000 W and about 2000 W, and a biasing voltage that is between about 175 V and about 250 V, with an $H_2$ flow that is between about 20 sccm and about 40 sccm and an Ar flow that is between about 400 sccm and about 500 sccm for a period of time of between about 50 seconds and about 300 seconds. Plasma-excited hydrogen species generated from the plasma inside process chamber 500 can reduce some or all oxides present on the exposed surface of a metal layer (e.g., p-type metal layer 350) of a partially formed conductive structure (e.g., metal gate structure 200). In some embodiments, the plasma-excited hydrogen species can also reduce some or all O atoms present in the bulk material of a metal nitride layer or other metal layers of the metal gate structure, such as p-type metal capping layer 204. Such reduction of O atoms is described above in conjunction with FIG. 3D.

In another exemplary embodiment, a plasma oxidation process is performed at a process temperature that is between about 300° C. and about 500° C., a chamber pressure that is between about 5 mT and about 20 mT, an RF power that is between about 100 W and about 2500 W, and a biasing voltage that is between about 175 V and about 250 V, with an $O_2$ flow that is between about 10 sccm and about 50 sccm, an $N_2$ flow that is between about 300 sccm and about 500 sccm, and an Ar flow that is between about 300 sccm and about 500 sccm for a period of time of between about 50 seconds and about 300 seconds. Plasma-excited oxygen species generated from the plasma inside process chamber 500 can fill vacancies present on the exposed surface and in the bulk material of a metal layer or layers of the metal gate structure, such as p-type metal layer 350. Such oxidation is described above in conjunction with FIG. 3E.

Figure 6:
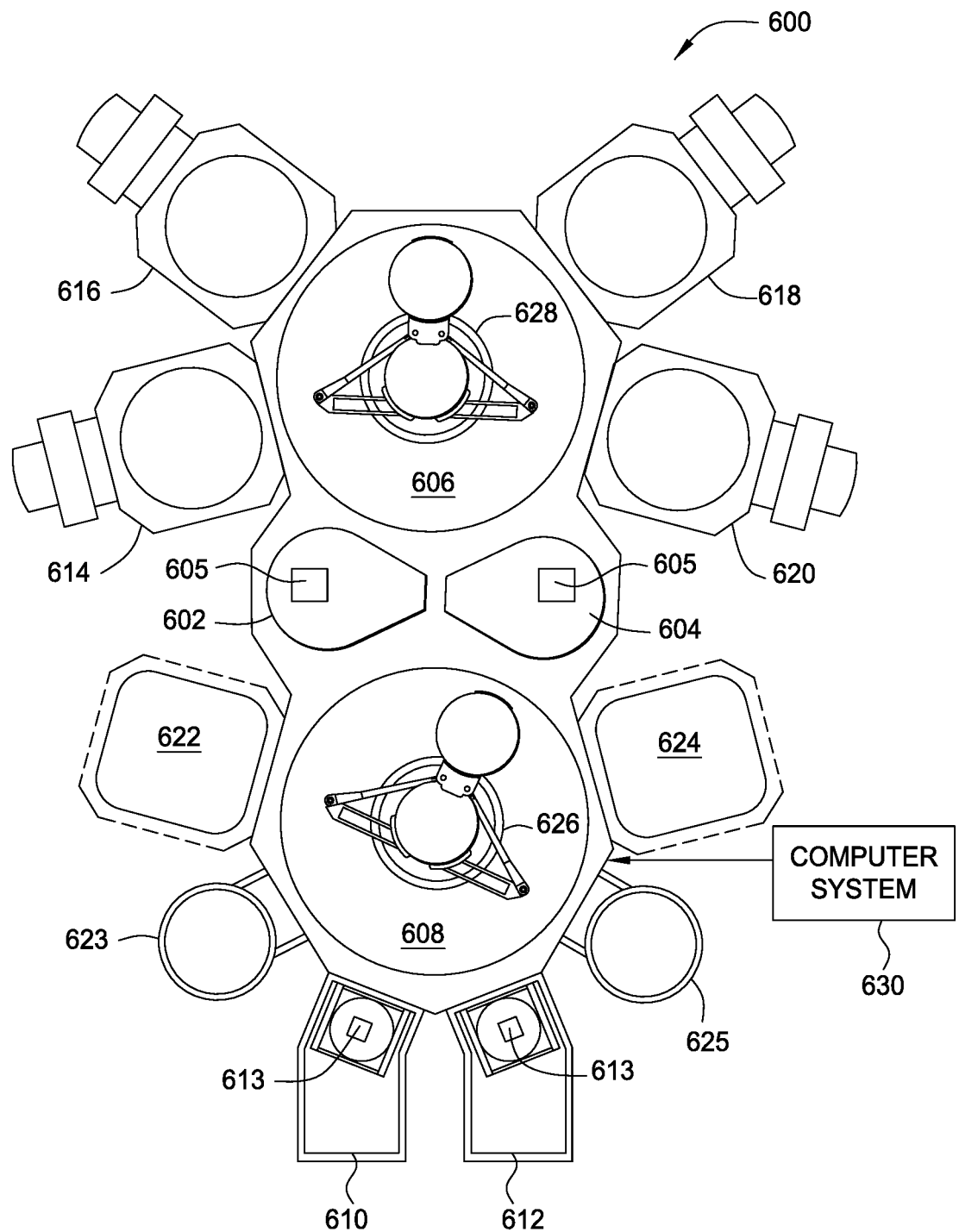
FIG. 6 is a top plan view of a multi-chamber processing system configured to implement one or more aspects of the present disclosure.

FIG. 6 is a top plan view of a multi-chamber processing system 600 configured to implement one or more aspects of the present disclosure. Multi-chamber processing system 600 is configured to perform one or more fabrication processes on individual substrates, such as silicon wafers, for forming semiconductor devices. Multi-chamber processing system 600 includes some or all of a transfer chamber 606, a buffer chamber 608, single wafer load locks 610 and 612, processing chambers 614, 616, 618, 620, 622, and 624, preheating chambers 623 and 625, and robots 626 and 628. Single wafer load locks 610 and 612 may include heating elements 613 and are attached to buffer chamber 608. Processing chambers 614, 616, 618, and 620 are attached to transfer chamber 606. Processing chambers 622 and 624 are attached to buffer chamber 608. The operation of multi-chamber processing system 600 is controlled by a computer system 630. Computer system 630 may be any device or combination of devices configured to implement the inventive operations provided herein. As such, computer system 630 may be a controller or array of controllers and/or a general purpose computer configured with software which, when executed, performs the inventive operations. One example of a suitable multi-chamber processing system 600 is the Endura® CL System manufactured by Applied Materials, Inc. of Santa Clara, Calif.

Each of processing chambers 614, 616, 618, 620, 622, and 624 may be configured to perform one or more process steps in the fabrication of a conductive structure in a semiconductor device, such as a contact structure for a field-effect transistor (FET). More specifically, processing chambers 614, 616, 618, 620, 622, and 624 may include one or more metal deposition chambers, surface cleaning and preparation chambers, thermal anneal and/or thermal hydrogenation chambers, and plasma hydrogenation/nitridization chambers.

In some embodiments multi-chamber processing system 600 may be configured to sequentially perform several process steps in the fabrication process of a metal gate structure. For example, a particular metal gate structure may include a TiN capping layer that is formed on a gate dielectric and is similar to p-type metal capping layer 204 in FIG. 2, and a TiN work function layer, that is formed on the TiN capping layer and is similar to p-type metal electrode layer 205 in FIG. 2. In such embodiments, processing chamber 614 and/or 616 may be configured to deposit the TiN capping layer on the gate dielectric; processing chamber 622 and/or 624 may be configured to densify the TiN capping layer by performing a rapid thermal processing (RTP) or other thermal anneal process on the TiN capping layer; processing chamber 618 may be configured to deposit the TiN work function layer; and processing chamber 620 may be configured to perform a hydrogenation process followed by an oxidation process. The sequential hydrogenation/oxidation process may be performed on an exposed surface of the TiN capping layer or on an exposed surface of the TiN work function layer. Thus, in such embodiments, a metal gate structure that has a modified work function can be completed without an air break and the resulting unwanted formation of suboxides on one or more layers of the metal gate structure.

In alternative embodiments, not all process steps for completing a metal gate structure are performed on a single multi-chamber processing system 600. For example, in some embodiments, multi-chamber processing system 600 may include metal deposition processing chambers for depositing one or more p-type metal layers 350, while a thermal anneal process may be performed on the p-type metal layer 350 via a different substrate processing system. In such embodiments, an air break occurs before the thermal anneal process, and it is known that such an air break can increase the presence of O atoms, in the form of suboxides, on an exposed surface of the metal layer. However, prior to the air break, a sequential plasma hydrogenation/plasma oxidation process can be performed, since multi-chamber processing system 600 may be configured with both metal deposition chambers and one or more plasma processing chambers. Thus, multi-chamber processing system 600 can be configured to perform a sequential hydrogenation/oxidation process on a substrate after deposition of p-type metal layer 350, but before the substrate is removed from multi-chamber processing system 600 and exposed to air. Performing the sequential hydrogenation/oxidation process on an exposed surface of p-type metal layer 350 prior to an air break can form stoichiometric oxides on and/or in p-type metal layer 350, and greatly reduce formation of suboxides on the exposed surface during the subsequent air break.

In some embodiments, multi-chamber processing system 600 may include one or more thermal anneal and plasma processing chambers. In such embodiments, a sequential hydrogenation/oxidation process can be performed after the thermal anneal process, thereby removing O atoms introduced by a pre-anneal air break and by the thermal anneal process itself. Typically, thermal annealing processes are not able to maintain desirably low oxygen levels required for most advanced device nodes, due to the high temperatures that the processing components (e.g., seals, process kit components, pumps, etc.) achieve during thermal processing. Thus, in such embodiments, p-type metal layer 350 is deposited in one processing system, and the p-type metal layer 350 then undergoes the thermal anneal process and the sequential hydrogenation and oxidation process in a different processing system.

In some embodiments, multi-chamber processing system 600 may include one or more metal deposition chambers configured to deposit p-type metal 350 and one or more plasma processing chambers to perform a sequential hydrogenation and oxidation process. In such embodiments, a sequential hydrogenation and oxidation process can be performed after the deposition of p-type metal layer 350 in a metal gate structure, thereby forming stoichiometric oxides on and in p-type metal layer 350. Consequently, the work function of p-type metal layer 350 is modified, and the formation of suboxides are on p-type metal layer 305 in a subsequent air break is greatly reduced. It is noted that in such embodiments, no air break occurs between the deposition of p-type metal layer and the sequential hydrogenation and oxidation process.

In the embodiments set forth above, the work function of a metal layer is modified via a hydrogenation process followed by an oxidation process to stoichiometrically add O atoms to the metal layer. In the oxidation process, an exposed surface of the metal layer is exposed to plasma-excited oxygen species, such as O ions, O atoms, and/or O radicals. In other embodiments, the work function of a metal layer is modified via a hydrogenation process followed by a plasma process in which other electro-negative atoms are added to the metal layer instead of O atoms. For example, such electro-negative atoms can include nitrogen, fluorine (F), and/or chlorine (Cl). Furthermore, in some embodiments, such electro-negative atoms can include any atoms having a Paulding electronegativity of at least about 2.5, i.e., carbon (C) atoms, sulfur (S) atoms, selenium (Se) atoms, bromine (Br) atoms, iodine (I) atoms, and the like. In such embodiments, an exposed surface of the metal layer is exposed to plasma-excited, electronegative species, to add atoms from the electronegative species to the metal layer and thereby modify the work function of the metal layer. As set forth above with respect to O atoms, addition of other electronegative species to the metal layer via a plasma process generally results in the stoichiometric addition of the electronegative atoms to the metal layer.

In some embodiments, the plasma process in which electronegative atoms are added to the metal layer can be performed via plasma processing chamber 500. In such embodiments, the above-described plasma oxygenation process can be modified with one or more different process gases. For example, in embodiments in which F atoms are added to a metal layer via exposure to plasma-excited, electronegative species, the process gases may include any fluorine-containing gas. In such embodiments, the plasma process is performed at a process temperature that is between about 300° C. and about 500° C., a chamber pressure that is between about 5 mT and about 20 mT, an RF power that is between about 1000 W and about 2500 W, and a biasing voltage that is between about 175 V and about 250 V, with a fluorine-containing process gas flow that is between about 10 sccm and about 50 sccm, an $N_2$ flow that is between about 300 sccm and about 500 sccm, and an Ar flow that is between about 300 sccm and about 500 sccm for a period of time of between about 50 seconds and about 300 seconds. For the addition of other electronegative atoms to a metal layer, such as Cl, Br, etc., one of skill in the art, upon reading the disclosure herein, can readily select the suitable process gases and process parameters.

Modifying Work Function of a Metal Layer

Figure 7:
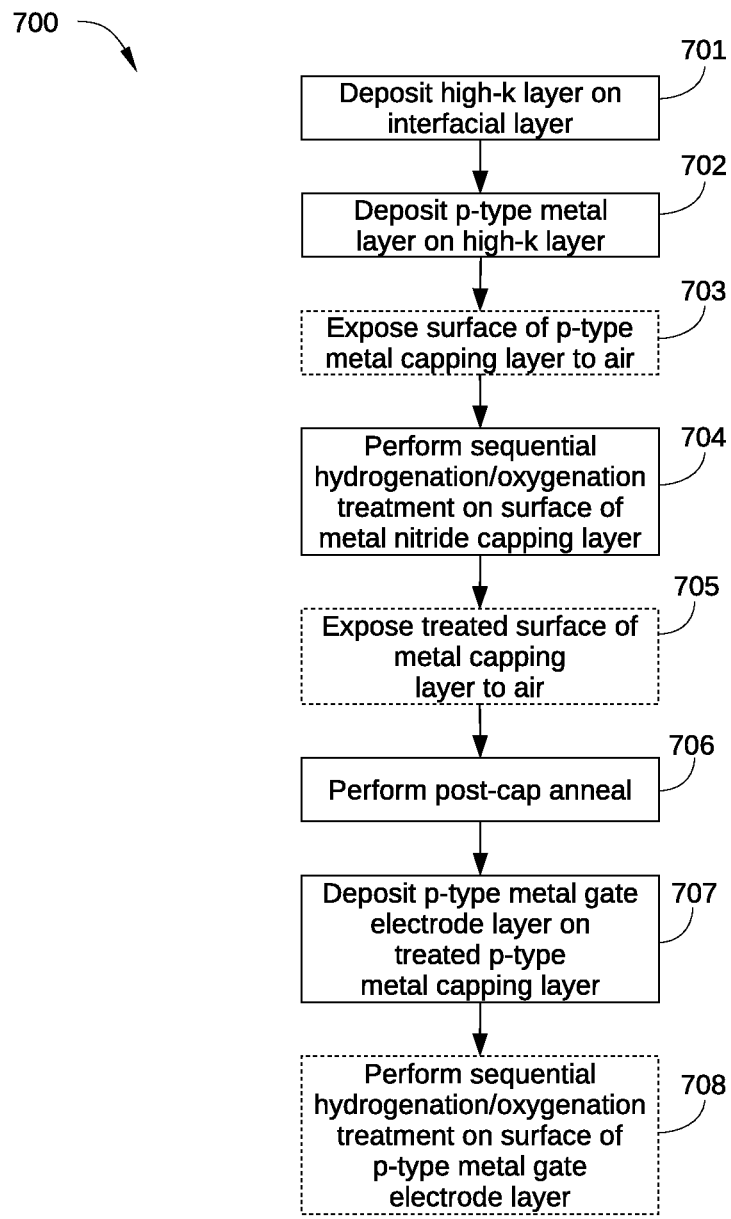
FIG. 7 sets forth a flow chart of process steps for modifying the work function of a metal layer in a metal gate structure, according to various embodiments of the disclosure.

FIG. 7 sets forth a flow chart of process steps for modifying the work function of a metal layer in a metal gate structure, according to various embodiments of the disclosure. FIGS. 8A-8E are schematic cross-sectional views of a semiconductor device corresponding to different stages of the process of FIG. 7, according to various embodiments of the disclosure.

Figure 8A:
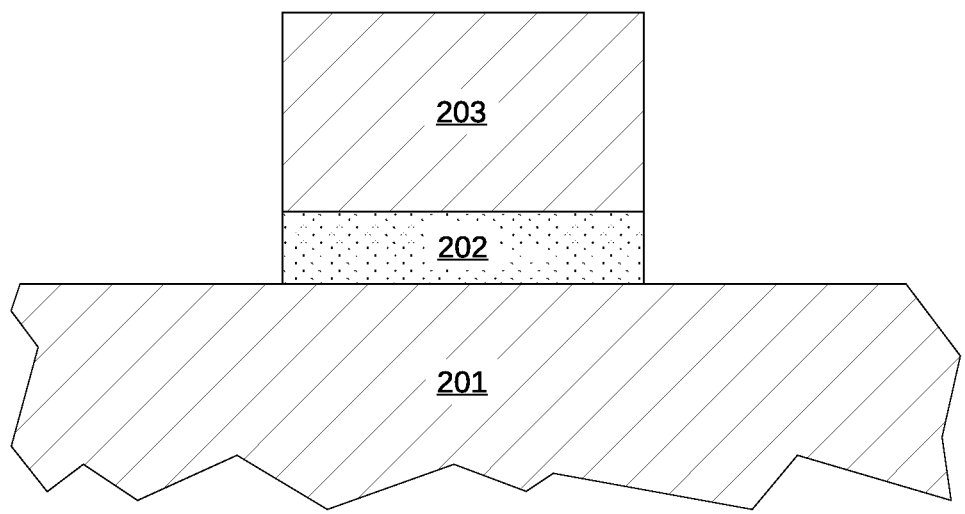
FIGS. 8A-8E are schematic cross-sectional views of a semiconductor device corresponding to different stages of the process of FIG. 7, according to various embodiments of the disclosure.

A method 700 begins at step 701, in which high-k dielectric layer 203 is deposited on interfacial oxide layer 202 as shown in FIG. 8A. High-k dielectric layer 203 may be formed via any suitable deposition method described above in conjunction with FIG. 2.

Figure 8B:
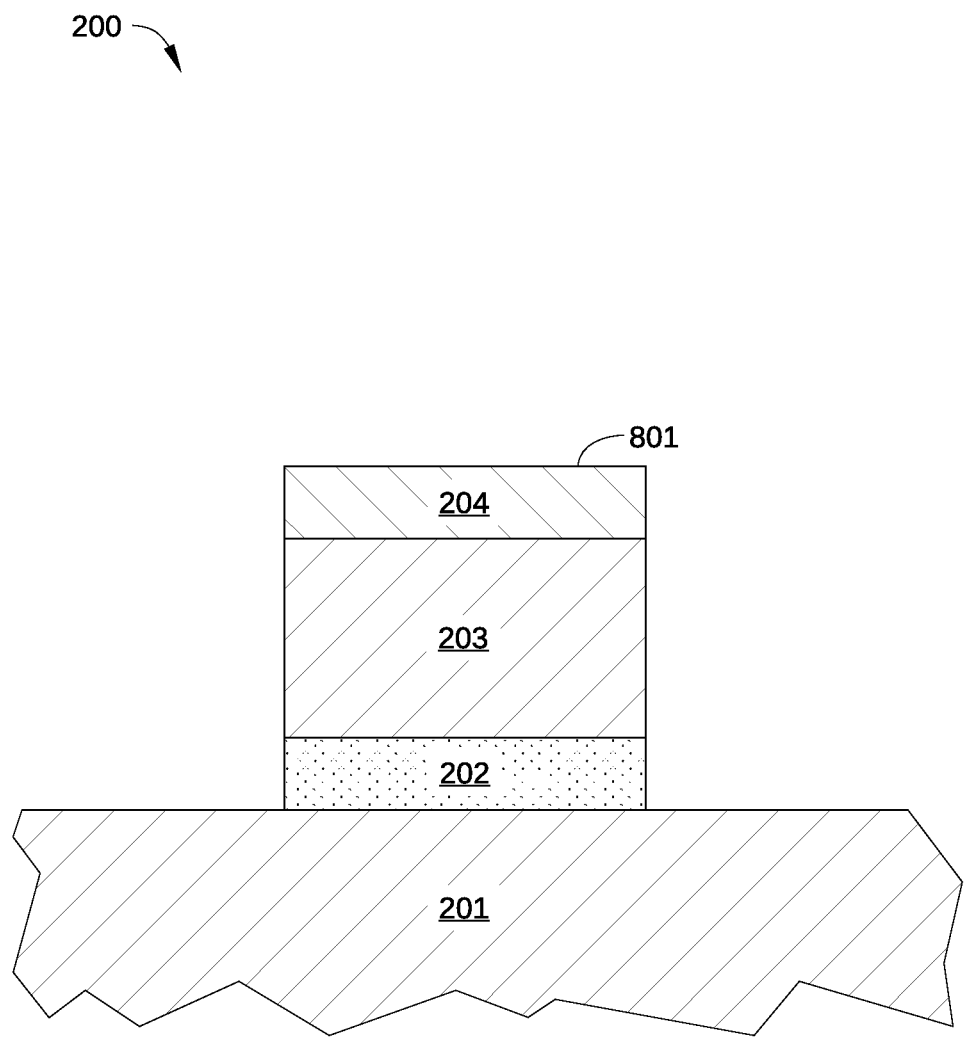

In step 702, p-type metal capping layer 204 is deposited on high-k dielectric layer 203, as shown in FIG. 8B. P-type metal capping layer 204 may be formed via any suitable deposition method described above in conjunction with FIG. 2. In some embodiments, p-type metal capping layer 204 includes vacancies (that may be similar to vacancies 213 in FIG. 2A) and/or electronegative atoms incorporated therein, such as suboxides or other non-stoichiometric compounds, by contamination present in the processing environment during the deposition process of step 702.

In optional step 703, an exposed surface 801, shown in FIG. 8B, is exposed to air. For example, in some embodiments, p-type metal capping layer 204 is deposited in one processing system, such as multi-chamber processing system 600 in FIG. 6, while the next processing step to be performed on semiconductor substrate 201 is performed in a different processing system. Thus, in such embodiments, semiconductor substrate 201 is exposed to air after the deposition of metal nitride layer 204. In embodiments in which p-type metal capping layer 204 is deposited in one chamber of a multi-chamber processing system and step 704 is performed in one or two other processing chambers of the same multi-chamber processing system, and optional step 703 is not performed.

Figure 8C:
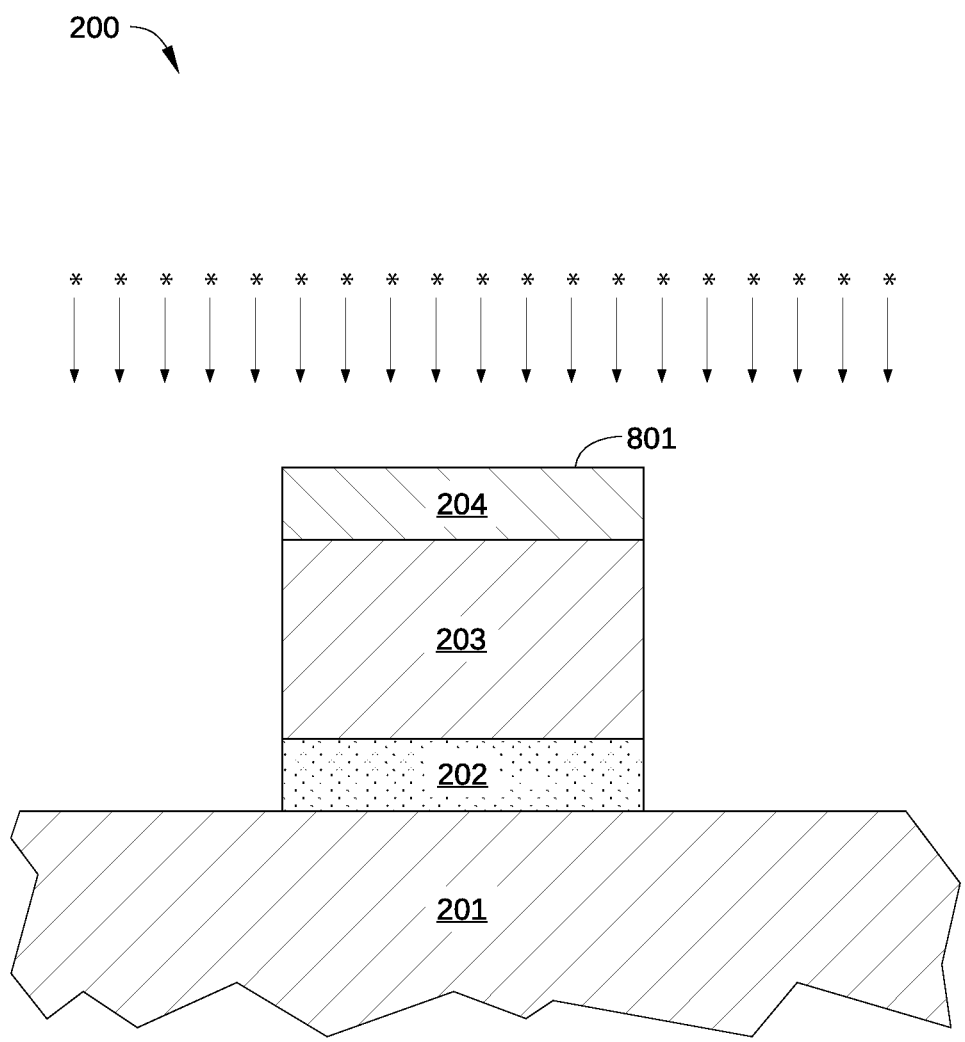

In step 704, a sequential plasma hydrogenation and oxidation process is performed on surface 801 of p-type metal capping layer 204, as shown in FIG. 8C. The plasma hydrogenation and oxidation processes may be substantially similar to the plasma hydrogenation and oxidation processes described above in conjunction with FIG. 4. Alternatively, instead of the oxidation process, a plasma process is performed on surface 801 in step 704, in which other electronegative atoms besides O atoms are included in p-type metal capping layer 204.

Thus, in step 704, surface 801 is exposed to plasma-excited hydrogen species generated in the plasma hydrogenation process, and some or all oxides present on surface 801 are reduced. In addition, in some embodiments, such plasma-excited hydrogen species can also reduce some or all oxygen (O) atoms present in the bulk material of p-type metal capping layer 204. Furthermore, in step 704 surface 801 is exposed to plasma-excited electronegative species generated in a second plasma process, thereby introducing electronegative atoms into p-type metal capping layer 204 and forming stoichiometric combinations of the electronegative atoms with atoms of p-type metal capping layer 204.

Alternatively, in some embodiments step 704 is not performed and method 700 proceeds to step 705. In such embodiments, the plasma hydrogenation and oxygenation processes (or other electronegative plasma processes) are instead performed in step 708 on p-type metal gate electrode layer 205.

In some embodiments, the plasma hydrogenation process of step 704 is performed in the same processing chamber as the plasma oxidation process of step 704, for example in process chamber 400 of FIG. 4. Alternatively, the plasma hydrogenation process of step 704 is performed in a first processing chamber of a multi-chamber processing system, while the plasma oxidation process of step 704 is performed in a second processing chamber of the same multi-chamber processing system. In either case, it is noted that surface 801 is not exposed to air between the plasma hydrogenation process and the plasma oxidation process of step 704. Thus, in either embodiment, surface 801 is not exposed to air after being exposed to the plasma-excited hydrogen species and before being exposed to the plasma-excited nitrogen species.

In some embodiments, prior to performing the plasma hydrogenation process in a processing chamber, a plasma-based conditioning process is performed in the processing chamber. In such embodiments, the processing chamber is treated with an oxygen-based, hydrogen-based, or nitrogen-based plasma without a substrate placed therein and before the substrate is treated via the above-described plasma hydrogenation process. Such plasma treatment of the process chamber prior to introducing a substrate to the chamber is sometimes referred to as a plasma every wafer (PEW) process or PEW treatment.

In some embodiments, such a PEW process includes introducing one or more non-oxygen-containing gases, such as $O_2$, $N_2$, $NH_3$, Ar, $H_2$, or any suitable combination thereof, into the process chamber, and energizing the one or more gases to form plasma. Alternatively, the PEW process may include introducing plasma-containing radicals and/or ions of O, N, H, or $NH_3$, or any suitable combination thereof, into the process chamber, where the plasma is formed in a remote plasma source outside of the process chamber. In one embodiment, an $NH_3$ gas or a combination of $NH_3$ and Ar gases is introduced into the process chamber. In another embodiment, $H_2$ gas or a combination of $H_2$ and Ar gases is introduced into the process chamber. In yet another embodiment, $N_2$ gas or a combination of $N_2$ and Ar gases is introduced into the process chamber. In yet another embodiment, $O_2$ gas or a combination of $O_2$ and Ar gases is introduced into the process chamber.

In some embodiments, during the PEW process, the one or more gases introduced into the processing chamber are energized by an RF power source, such as RF power source 514 of FIG. 5. The RF power may be pulsed at 2% to 70% duty cycle and may range from about 100 W to about 2500 W. The RF power may be a continuous wave ranging from about 100 W to about 2500 W. The processing chamber may have a chamber pressure ranging from about 10 mT to about 200 mT during the PEW treatment of the processing chamber. The process temperature, which in some embodiments is defined as the temperature of the substrate support pedestal, such as pedestal 504 in FIG. 5, may range from about 20° C. to about 500° C. In general, the plasma formed during the PEW treatment may be formed by use of an inductively or capacitively coupled plasma.

In optional step 705, exposed surface 801 is exposed to air. For example, in some embodiments, the above-described sequential hydrogenation and oxidation process is performed in one processing system, while the next processing step to be performed on semiconductor substrate 201 is performed in a different processing system. Thus, in such embodiments, semiconductor substrate 201 is exposed to air after the deposition of metal nitride layer 204. In embodiments in which the sequential hydrogenation and oxidation process is performed in one chamber of a multi-chamber processing system and step 706 is performed in another processing chamber of the same multi-chamber processing system, optional step 705 is not performed.

In step 706, a thermal anneal process, such as a post-cap anneal, is performed on semiconductor substrate 201, interfacial oxide layer 202, high-k dielectric layer 203, and p-type metal capping layer 204. For example, in some embodiments, a spike anneal process is performed in step 706, in which a peak temperature of about 600 to 900° C. is reached. The post-cap anneal is performed on partially formed metal gate structure 200 to densify p-type metal capping layer 204.

Figure 8D:
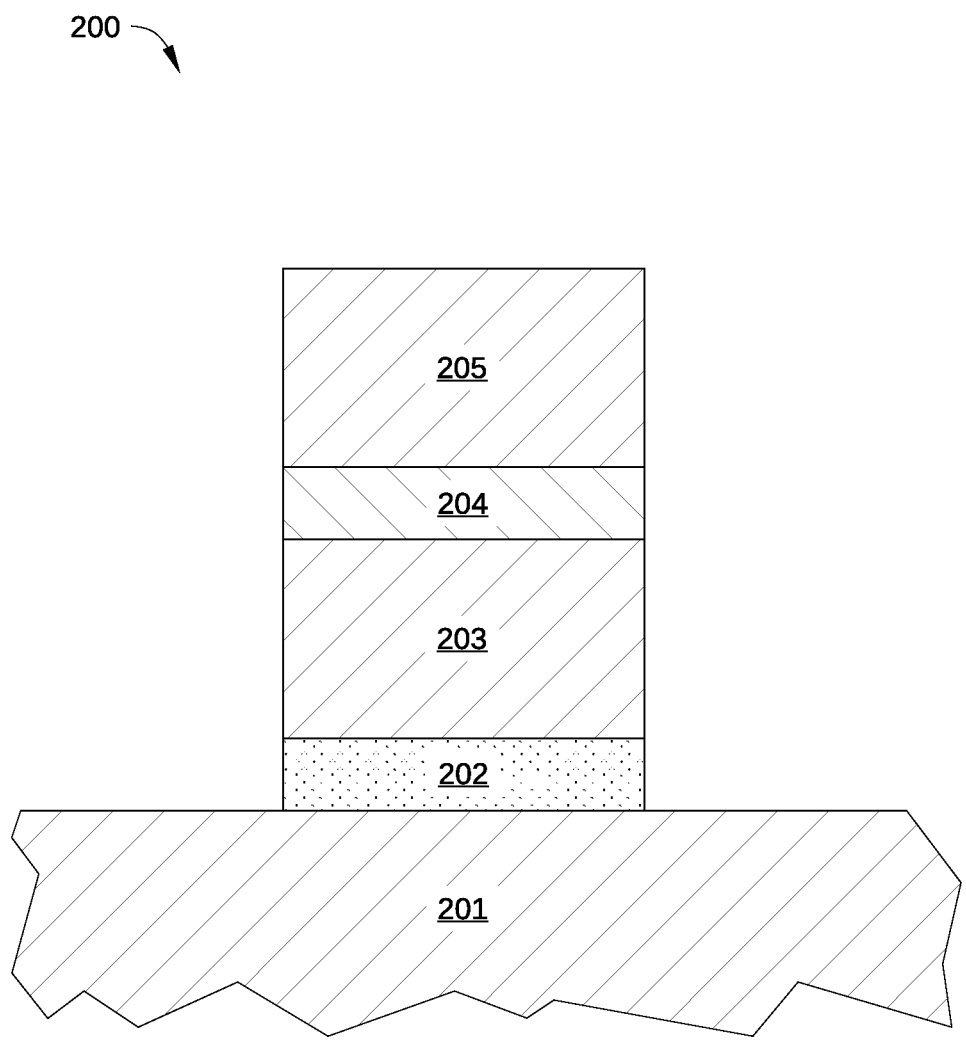

In step 707, p-type metal gate electrode layer 205 is deposited on the treated p-type metal capping layer 204, as shown in FIG. 8D, thereby completing formation of metal gate structure 200. P-type metal gate electrode layer 205 may be formed via any suitable deposition method described above in conjunction with FIG. 2.

Figure 8E:
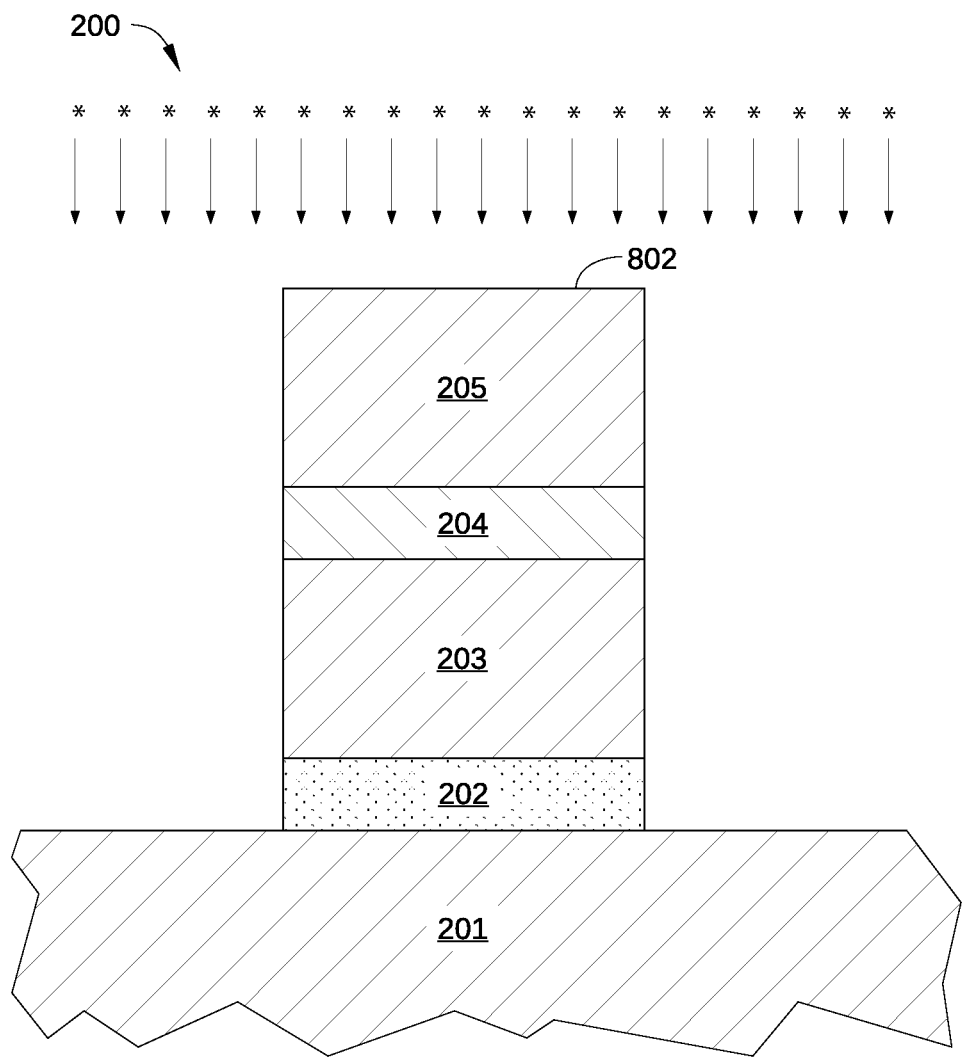

In optional step 708, an exposed surface 802 of p-type metal gate electrode layer 205 is exposed to plasma-excited hydrogen species generated in the plasma hydrogenation process, as shown in FIG. 8E. As a result, some or all oxides or other electronegative atoms present on surface 802 and within p-type metal gate electrode layer 205 are reduced. In addition, in step 708 surface 802 is exposed to plasma-excited electronegative species generated in a second plasma process, thereby introducing electronegative atoms into p-type metal gate electrode layer 205 and forming stoichiometric combinations of the electronegative atoms with atoms of p-type metal gate electrode layer 205.

Typically, optional step 708 is performed on surface 802 when step 704 is not performed on surface 801. In some embodiments, the plasma processes of step 708 are substantially similar to the plasma processes of step 704.

Figure 9:
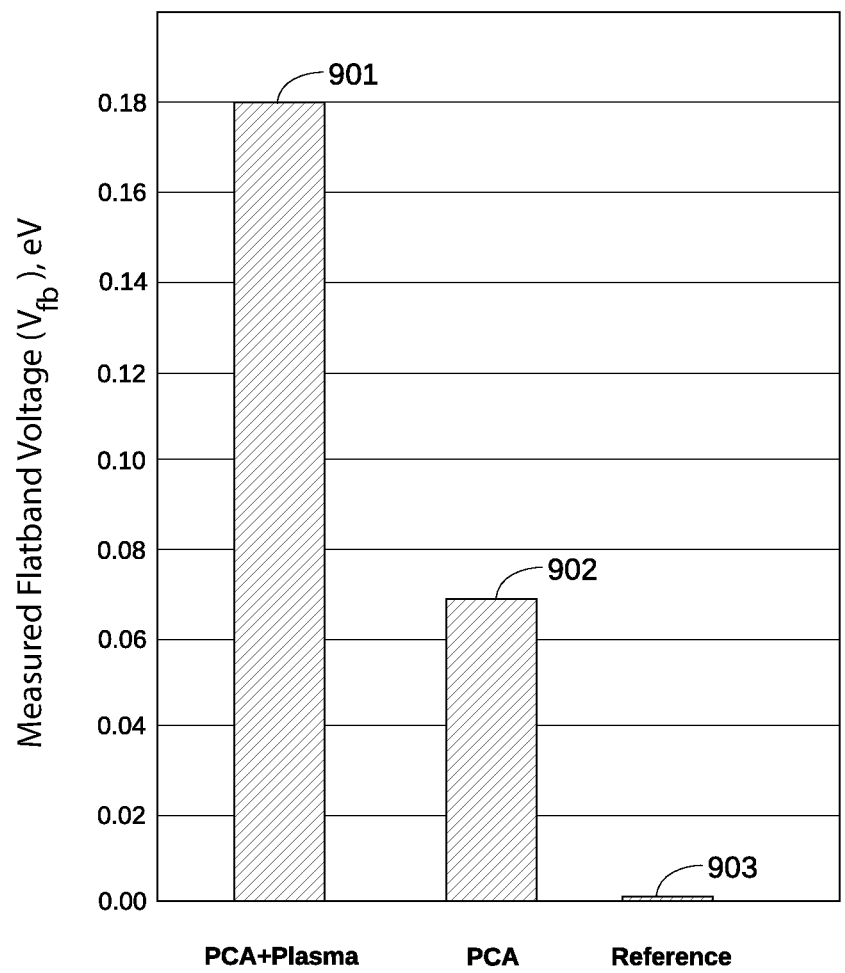
FIG. 9 sets forth a bar graph that compares measured flatband voltage ($V_{fb}$) shift for a p-type metal layer after various treatments.

FIG. 9 sets forth a bar graph 900 that compares measured flatband voltage ($V_{fb}$) shift for a p-type metal layer after various treatments. Specifically, bar graph 900 includes a measured flatband voltage 901 for a TiN capping layer that has undergone a post-cap anneal process and a plasma hydrogenation and oxidation process according to an embodiment of the disclosure. The TiN capping layer associated with measured flatband voltage 901 is substantially similar to p-type metal capping layer 204 in FIG. 2. As is well-known in the art, if there is no charge present in the oxide or at the oxide-semiconductor interface, the flatband voltage in a metal gate structure equals the work function difference between the gate metal work function $\phi_m$ and the semiconductor work function $\phi_s$ (each of which is in FIG. 1).

For reference, bar graph 900 also includes a measured flatband voltage 902 for a similar TiN capping layer that has undergone a post-cap anneal process but no plasma hydrogenation or oxidation process, as well as a measured flatband voltage 903 for a similar TiN capping layer that has not undergone a post-cap anneal process or a plasma hydrogenation/oxidation process. As shown, measured flatband voltage 901 is indicates an approximate 180 mV shift compared to measured flatband voltage 902, where no plasma hydrogenation and oxidation treatment has occurred. Similarly, measured flatband voltage 901 indicates an approximate 110 mV shift compared to measured flatband voltage 903, where no plasma hydrogenation and oxidation treatment or post-cap anneal treatment has occurred.

The TiN capping layer associated with measured flatband voltage 901 is substantially the same as the TiN capping layer associated with measured flatband voltage 902, except that the plasma hydrogenation/oxidation process has been applied to the TiN capping layer associated with measured flatband voltage 901. Consequently, the 110 mV flatband voltage shift between measured flatband voltage 901 and measured flatband voltage 902 can be mostly or entirely attributed to a change in work function of the TiN capping layer by the plasma hydrogenation/oxidation process described herein.

In some embodiments disclosed herein, a sequential plasma process is employed to enable the modification of the work function of a p-type metal layer in a metal gate structure. The sequential plasma process includes a plasma hydrogenation and a plasma process that includes electronegative species. The sequential plasma process is performed on a p-type metal layer in a film stack, thereby replacing suboxides and/or other non-stoichiometrically combined electronegative atoms disposed on or within layers of the film stack with stoichiometrically combined electronegative atoms, such as O atoms. As a result, the work function of the p-type metal layer can be modified without changing a thickness of the p-type metal layer.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a transistor, the method comprising:
depositing a high-k dielectric layer over a surface of a semiconductor material, wherein the surface of the semiconductor material has a first work function value;
after depositing the high-k dielectric layer, depositing a p-type metal layer over the semiconductor material and the high-k dielectric layer, wherein the p-type metal layer has an exposed surface and a second work function value, and wherein depositing the p-type metal layer comprises:
depositing a first p-type metal layer on the high-k dielectric layer; and
depositing a second p-type metal layer on the first p-type metal layer; and
exposing the exposed surface of the p-type metal layer to plasma-excited electronegative species to change the second work function value to a third work function value, wherein the third work function value is between the first work function value and the second work function value.

2. The method of claim 1, wherein the first p-type metal layer comprises a metal capping layer that is deposited on the high-k dielectric layer.

3. The method of claim 2, further comprising, exposing an exposed surface of the metal capping layer to plasma-excited electronegative species prior to depositing the second p-type metal layer.

4. The method of claim 3, wherein the second p-type metal layer comprises a work function layer that is deposited on the metal capping layer.

5. The method of claim 3, further comprising, after exposing the exposed surface of the metal capping layer to plasma-excited electronegative species and prior to depositing the second p-type metal layer on the exposed surface, exposing the exposed surface of the metal capping layer to air.

6. The method of claim 1, wherein exposing the exposed surface of the p-type metal layer to plasma-excited electronegative species comprises stoichiometrically adding atoms from the electronegative species to the p-type metal layer.

7. The method of claim 1, wherein the plasma-excited electronegative species include atoms having a Paulding electronegativity of at least about 2.5.

8. The method of claim 1, wherein the plasma-excited electronegative species include at least one of an oxygen-containing species, a nitrogen-containing species, and a fluorine-containing species.

9. The method of claim 1, wherein the p-type metal layer comprises a metal with a work function value that is equal to or greater than the first work function value.

10. The method of claim 1, further comprising, prior to exposing the exposed surface of the p-type metal layer to plasma-excited electronegative species, exposing the exposed surface to plasma-excited hydrogen species to remove electronegative atoms from the p-type metal layer.

11. The method of claim 10, wherein exposing the exposed surface to plasma-excited hydrogen species comprises forming vacancies in the p-type metal layer.

12. The method of claim 11, wherein exposing the exposed surface of the p-type metal layer to plasma-excited electronegative species comprises filling the formed vacancies in the p-type metal layer with electronegative atoms.

13. The method of claim 10, wherein the exposed surface is not exposed to air after being exposed to the plasma-excited hydrogen species and before being exposed to the plasma-excited electronegative species.

14. The method of claim 10, wherein the exposed surface is exposed to the plasma-excited hydrogen species and to the plasma-excited electronegative species in a same processing chamber.

15. The method of claim 1, wherein the plasma-excited electronegative species are formed by use of an inductively coupled plasma that is disposed adjacent to a surface of the exposed surface of the p-type metal layer.

16. The method of claim 1, further comprising, prior to exposing the exposed surface of the p-type metal layer to plasma-excited electronegative species, performing a plasma-based conditioning process on a process chamber in which the exposed surface is exposed to the plasma-excited electronegative species.

17. The method of claim 16, wherein the plasma-based conditioning process is performed on the process chamber when a semiconductor substrate on which the p-type metal layer is deposited is not disposed within the process chamber.

* * * * *